United States Patent
Lung

(10) Patent No.: US 7,932,101 B2
(45) Date of Patent: Apr. 26, 2011

(54) THERMALLY CONTAINED/INSULATED PHASE CHANGE MEMORY DEVICE AND METHOD

(75) Inventor: Hsiang-Lan Lung, Elmsford, NY (US)

(73) Assignee: Macronix International Co., Ltd., Hsinchu (TW)

( * ) Notice: Subject to any disclaimer, the term of this patent is extended or adjusted under 35 U.S.C. 154(b) by 426 days.

(21) Appl. No.: 12/050,676

(22) Filed: Mar. 18, 2008

(65) Prior Publication Data
US 2008/0166875 A1  Jul. 10, 2008

Related U.S. Application Data

(62) Division of application No. 11/338,284, filed on Jan. 24, 2006, now Pat. No. 7,394,088.

(60) Provisional application No. 60/736,721, filed on Nov. 15, 2005.

(51) Int. Cl.
*H01L 21/00* (2006.01)

(52) U.S. Cl. ............... 438/3; 438/238; 438/900; 257/2; 257/3; 257/295; 257/E31.029; 365/100; 365/148; 365/163

(58) Field of Classification Search .................. None
See application file for complete search history.

(56) References Cited

U.S. PATENT DOCUMENTS

| | | | |
|---|---|---|---|
| 3,271,591 A | 9/1966 | Ovshinsky | |
| 3,530,441 A | 9/1970 | Ovshinsky | |
| 4,599,705 A | 7/1986 | Holmberg et al. | |
| 4,719,594 A | 1/1988 | Young et al. | |
| 4,876,220 A | 10/1989 | Mohsen et al. | |
| 4,959,812 A | 9/1990 | Momodomi | |
| 5,166,096 A | 11/1992 | Cote et al. | |
| 5,166,758 A | 11/1992 | Ovshinsky et al. | |
| 5,177,567 A | 1/1993 | Klersy et al. | |
| 5,515,488 A | 5/1996 | Hoppe | |
| 5,534,712 A | 7/1996 | Ovshinsky et al. | |
| 5,687,112 A | 11/1997 | Ovshinsky | |
| 5,789,277 A | 8/1998 | Zahorik et al. | |
| 5,789,758 A | 8/1998 | Reinberg | |
| 5,814,527 A | 9/1998 | Wolstenholme et al. | |

(Continued)

FOREIGN PATENT DOCUMENTS

TW  518719  1/2003

(Continued)

OTHER PUBLICATIONS

Adler, David, "Amorphous-Semiconductor Devices," Sci. Amer., vol. 236, pp. 36-48, May 1977.

(Continued)

*Primary Examiner* — Evan Pert
*Assistant Examiner* — Scott Wilson
(74) *Attorney, Agent, or Firm* — Haynes Beffel & Wolfeld LLP

(57) ABSTRACT

A memory device with improved heat transfer characteristics. The device first includes a dielectric material layer; first and second electrodes, vertically separated and having mutually opposed contact surfaces. A phase change memory element is encased within the dielectric material layer, including a phase-change layer positioned between and in electrical contact with the electrodes, wherein the lateral extent of the phase change layer is less than the lateral extent of the electrodes. An isolation material is positioned between the phase change layer and the dielectric layer, wherein the thermal conductivity of the isolation material is lower than the thermal conductivity of the dielectric material.

10 Claims, 26 Drawing Sheets

U.S. PATENT DOCUMENTS

| | | |
|---|---|---|
| 5,831,276 A | 11/1998 | Gonzalez et al. |
| 5,837,564 A | 11/1998 | Sandhu et al. |
| 5,869,843 A | 2/1999 | Harshfield |
| 5,879,955 A | 3/1999 | Gonzalez et al. |
| 5,920,788 A | 7/1999 | Reinberg |
| 5,952,671 A | 9/1999 | Reinberg et al. |
| 5,958,358 A | 9/1999 | Tenne |
| 5,970,336 A | 10/1999 | Wolstenholme et al. |
| 5,985,698 A | 11/1999 | Gonzalez et al. |
| 5,998,244 A | 12/1999 | Wolstenholme et al. |
| 6,011,725 A | 1/2000 | Eitan |
| 6,025,220 A | 2/2000 | Sandhu |
| 6,031,287 A | 2/2000 | Harshfield |
| 6,034,882 A | 3/2000 | Johnson et al. |
| 6,077,729 A | 6/2000 | Harshfield |
| 6,087,269 A | 7/2000 | Williams |
| 6,087,674 A | 7/2000 | Ovshinsky et al. |
| 6,104,038 A | 8/2000 | Gonzalez et al. |
| 6,111,264 A | 8/2000 | Wolstenholme et al. |
| 6,114,713 A | 9/2000 | Zahorik |
| 6,117,720 A | 9/2000 | Harshfield |
| 6,147,395 A | 11/2000 | Gilgen |
| 6,150,253 A | 11/2000 | Doan et al. |
| 6,153,890 A | 11/2000 | Wolstenholme et al. |
| 6,177,317 B1 | 1/2001 | Huang et al. |
| 6,185,122 B1 | 2/2001 | Johnson et al. |
| 6,189,582 B1 | 2/2001 | Reinberg et al. |
| 6,236,059 B1 | 5/2001 | Wolstenholme et al. |
| RE37,259 E | 7/2001 | Ovshinsky |
| 6,271,090 B1 | 8/2001 | Huang et al. |
| 6,280,684 B1 | 8/2001 | Yamada et al. |
| 6,287,887 B1 | 9/2001 | Gilgen |
| 6,314,014 B1 | 11/2001 | Lowrey et al. |
| 6,320,786 B1 | 11/2001 | Chang et al. |
| 6,339,544 B1 | 1/2002 | Chiang et al. |
| 6,351,406 B1 | 2/2002 | Johnson et al. |
| 6,420,215 B1 | 7/2002 | Knall et al. |
| 6,420,216 B1 | 7/2002 | Clevenger et al. |
| 6,423,621 B2 | 7/2002 | Doan et al. |
| 6,429,064 B1 | 8/2002 | Wicker |
| 6,462,353 B1 | 10/2002 | Gilgen |
| 6,483,736 B2 | 11/2002 | Johnson et al. |
| 6,487,114 B2 | 11/2002 | Jong et al. |
| 6,501,111 B1 | 12/2002 | Lowrey |
| 6,511,867 B2 | 1/2003 | Lowrey et al. |
| 6,512,241 B1 | 1/2003 | Lai |
| 6,514,788 B2 | 2/2003 | Quinn |
| 6,534,781 B2 | 3/2003 | Dennison |
| 6,545,903 B1 | 4/2003 | Wu |
| 6,548,394 B1 | 4/2003 | Peng et al. |
| 6,555,860 B2 | 4/2003 | Lowrey et al. |
| 6,563,156 B2 | 5/2003 | Harshfield |
| 6,566,700 B2 | 5/2003 | Xu |
| 6,567,293 B1 | 5/2003 | Lowrey et al. |
| 6,579,760 B1 | 6/2003 | Lung |
| 6,586,761 B2 | 7/2003 | Lowrey |
| 6,589,714 B2 | 7/2003 | Maimon et al. |
| 6,593,176 B2 | 7/2003 | Dennison |
| 6,597,009 B2 | 7/2003 | Wicker |
| 6,605,527 B2 | 8/2003 | Dennison et al. |
| 6,605,821 B1 | 8/2003 | Lee et al. |
| 6,607,974 B2 | 8/2003 | Harshfield |
| 6,613,604 B2 | 9/2003 | Maimon et al. |
| 6,617,192 B1 | 9/2003 | Lowrey et al. |
| 6,621,095 B2 | 9/2003 | Chiang et al. |
| 6,627,530 B2 | 9/2003 | Li et al. |
| 6,639,849 B2 | 10/2003 | Takahashi et al. |
| 6,673,700 B2 | 1/2004 | Dennison et al. |
| 6,744,088 B1 | 6/2004 | Dennison |
| 6,791,102 B2 | 9/2004 | Johnson et al. |
| 6,797,979 B2 | 9/2004 | Chiang et al. |
| 6,800,504 B2 | 10/2004 | Li |
| 6,800,563 B2 | 10/2004 | Xu |
| 6,815,704 B1 | 11/2004 | Chen |
| 6,830,952 B2 | 12/2004 | Lung |
| 6,850,432 B2 | 2/2005 | Lu |
| 6,859,389 B2 | 2/2005 | Idehara |
| 6,861,267 B2 | 3/2005 | Xu et al. |
| 6,864,500 B2 | 3/2005 | Gilton |
| 6,864,503 B2 | 3/2005 | Lung |
| 6,867,638 B2 | 3/2005 | Saiki et al. |
| 6,888,750 B2 | 5/2005 | Walker et al. |
| 6,894,305 B2 | 5/2005 | Yi et al. |
| 6,897,467 B2 | 5/2005 | Doan et al. |
| 6,903,362 B2 | 6/2005 | Wyeth et al. |
| 6,909,107 B2 | 6/2005 | Rodgers et al. |
| 6,927,410 B2 * | 8/2005 | Chen ................................ 257/2 |
| 6,933,516 B2 | 8/2005 | Xu |
| 6,936,840 B2 | 8/2005 | Sun et al. |
| 6,937,507 B2 | 8/2005 | Chen |
| 6,992,932 B2 | 1/2006 | Cohen |
| 7,023,009 B2 | 4/2006 | Kostylev et al. |
| 7,033,856 B2 | 4/2006 | Lung |
| 7,042,001 B2 | 5/2006 | Kim et al. |
| 7,067,865 B2 | 6/2006 | Lung |
| 7,126,149 B2 | 10/2006 | Iwasaki |
| 7,132,675 B2 | 11/2006 | Gilton |
| 7,166,533 B2 | 1/2007 | Happ |
| 7,214,958 B2 | 5/2007 | Happ |
| 7,220,983 B2 | 5/2007 | Lung |
| 7,238,994 B2 | 7/2007 | Chen |
| 7,321,130 B2 | 1/2008 | Lung |
| 7,485,891 B2 | 2/2009 | Hamann et al. |
| 2002/0017701 A1 | 2/2002 | Klersy et al. |
| 2004/0051094 A1 | 3/2004 | Ooishi |
| 2005/0006681 A1 | 1/2005 | Okuno |
| 2005/0029502 A1 | 2/2005 | Hudgens |
| 2005/0093022 A1 | 5/2005 | Lung |
| 2005/0127347 A1 | 6/2005 | Choi et al. |
| 2005/0201182 A1 | 9/2005 | Osada |
| 2005/0212024 A1 | 9/2005 | Happ |
| 2005/0215009 A1 | 9/2005 | Cho |
| 2006/0108667 A1 | 5/2006 | Lung |
| 2006/0110878 A1 | 5/2006 | Lung |
| 2006/0118913 A1 | 6/2006 | Yi et al. |
| 2006/0234138 A1 | 10/2006 | Fehlhaber |
| 2006/0286709 A1 | 12/2006 | Lung |
| 2007/0037101 A1 | 2/2007 | Morioka |
| 2007/0045606 A1 | 3/2007 | Magistretti et al. |
| 2007/0108429 A1 | 5/2007 | Lung |
| 2007/0111429 A1 | 5/2007 | Lung |
| 2007/0138458 A1 | 6/2007 | Lung |
| 2009/0078926 A1 * | 3/2009 | Lee ................................ 257/4 |

FOREIGN PATENT DOCUMENTS

| | | |
|---|---|---|
| WO | WO 00/45108 A1 | 8/2000 |
| WO | WO 00/79539 A1 | 12/2000 |
| WO | WO-0108213 | 2/2001 |
| WO | WO-2006084856 | 8/2006 |

OTHER PUBLICATIONS

Adler, D. et al., "Threshold Switching in Chalcogenide-Glass Thin Films," J. Appl/ Phys 51(6), Jun. 1980, pp. 3289-3309.

Ahn, S.J. et al., "A Highly Manufacturable High Density Phase Change Memory of 64 Mb and Beyond," IEEE IEDM 2004, pp. 907-910.

Axon Technologies Corporation paper: Technology Description, pp. 1-6.

Bedeschi, F. et al., "4-MB MOSFET-Selected Phase-Change Memory Experimental Chip," IEEE, 2004, 4 pp.

Blake thesis, "Investigation of GeTeSb5 Chalcogenide Films for Use as an Analog Memory," AFIT/GE/ENG/00M-04, Mar. 2000, 121 pages.

Chen, An et al., "Non-Volatile Resistive Switching for Advanced Memory Applications," IEEE IEDM , Dec. 5-7, 2005, 4 pages.

Cho, S. L. et al., "Highly Scalable On-axis Confined Cell Structure for High Density PRAM beyond 256Mb," 2005 Symposium on VLSI Technology Digest of Technical Papers, pp. 96-97.

Gibson, G. A. et al, "Phase-change Recording Medium that Enables Ultrahigh-density Electron-beam Data Storage," Applied Physics Letter, 2005, 3 pp., vol. 86.

Gill, Manzur et al., "A High-Performance Nonvolatile Memory Technology for Stand-Alone Memory and Embedded Applications," 2002 IEEE-ISSCC Technical Digest (TD 12.4), 7 pp.

Ha, Y. H. et al., "An Edge Contact Type Cell fro Phase Change RAM Featuring Very Low Power Consumption," 2003 Symposium on VLSI Technology Digest of Technical Papers, pp. 175-176.

Happ, T. D. et al., "Novel None-Mask Self-Heating Pillar Phase Change Memory," 2006 Symposium on VLSI Technology, 2 pp.

Haring Bolivar, P. et al., "Lateral Design for Phase Change Random Access Memory Cells with Low-Current Consumption," presented at $3^{rd}$ E*PCOS 04 Symposium in Balzers, Principality of Liechtenstein, Sep. 4-7, 2004, 4 pp.

Horii, H. et al., "A Novel Cell Technology Using N-doped GeSbTe Films for Phase Change RAM," 2003 Symposium on VLSI Technology Digest of Technical Papers, pp. 177-178.

Hudgens, S. et al., "Overview of Phase-Change Chalcogenide Non-volatile Memory Technology," MRS Bulletin, Nov. 2004, pp. 829-832.

Iwasaki, Hiroko et al., "Completely Erasable Phase Change Optical Disk," Jpn. J. Appl. Phys., Feb. 1992, pp. 461-465, vol. 31.

Jeong, C. W. et al., "Switching Current Scaling and Reliability Evaluation in PRAM," IEEE Non-Volatile Semiconductor Memory Workshop, Monterey, CA, 2004, pp. 28-29 and workshop cover sheet.

Kim, Kinam et al., "Reliability Investigations for Manufacturable High Density PRAM," IEEE $43^{rd}$ Annual International Reliability Physics Symposium, San Jose, 2005, pp. 157-162.

Kojima, Rie et al., "Ge-Sn-Sb-Te Phase-change Recording Material Having High Crystallization Speed," Proceedings of PCOS 2000, pp. 36-41.

Lacita, A. L.; "Electrothermal and Phase-change Dynamics in Chalcogenide-based Memories," IEEE IEDM 2004, 4 pp.

Lai, Stefan, "Current Status of the Phase Change Memory and Its Future," IEEE IEDM 2003, pp. 255-258.

Lai, Stephan et al., OUM-A 180 nm Nonvolatile Memory Cell Element Technology for Stand Alone and Embedded Applications, IEEE IEDM 2001, pp. 803-806.

Lankhorst, Martijn H. R., et al; Low-Cost and Nanoscale Non-Volatile Memory Concept for Future Silicon Chips, Mar. 13, 2005, 6 pp., Nature Materials Advance Online Publication, www.nature.com/naturematerials.

"Magnetic Bit Boost," www.sciencenews.org, Dec. 18 & 25, 2004, p. 389, vol. 166.

Mott, Nevill, "Electrons in Glass," Nobel Lecture, Dec. 8, 1977, Physics, 1977, pp. 403-413.

"New Memories Tap Spin, Gird for Battle," Science News, Apr. 3, 1999, p. 223, vol. 155.

Ovonyx Non-Confidential paper entitled "Ovonic Unified Memory," Dec. 1999, pp. 1-80.

Ovshinsky, Sandford R., "Reversible Electrical Switching Phenomena in Disordered Structures," Physical Review Letters, vol. 21, No. 20, Nov. 11, 1968, pp. 1450-1453.

Owen, Alan E. et al., "Electronic Conduction and Switching in Chalcogenide Glasses," IEEE Transactions on Electron Devices, vol. Ed. 20, No. 2, Feb. 1973, pp. 105-122.

Pellizer, F. et al., "Novel µTrench Phase-Change Memory Cell for Embedded and Stand-Alone Non-Volatile Memory Applications," 2004 Symposium on VLSI Technology Digest of Technical Papers, pp. 18-19.

Pirovano, Agostino et al., "Reliability Study of Phase-Change Non-volatile Memories," IEEE Transactions on Device and Materials Reliability, Sep. 2004, pp. 422-427, vol. 4, No. 3.

Prakash, S. et al., "A Guideline for Designing Chalcogenide-Based Glasses for Threshold Switching Characteristics," IEEE Electron Device Letters, vol. 18, No. 2, Feb. 1997, pp. 45-47.

Radaelli, A. et al., "Electronic Switching Effect and Phase-Change Transition in Chalcogenide Materials," IEEE Electron Device Letters, Oct. 2004, pp. 684-686, vol. 25, No. 10.

"Remembering on the Cheap," www.sciencenews.org, Mar. 19, 2005, p. 189, vol. 167.

Rochefort, C. et al., "Manufacturing of High Aspect-Ration p-n. Junctions Using Vapor Phase Doping for Application in Multi-Resurf Devices," IEEE 2002.

Strauss, Karl F. et al., "Overview of Radiation Tolerant Unlimited Write Cycle Non-Volatile Memory," IEEE 2000.

Subramanian, Vivek et al., "Low Leakage Germanium-Seeded Laterally-Crystallized Single-Grain 100-nm TFT's for Vertical Intergration Applications," IEEE Electron Device Letters, vol. 20, No. 7, Jul. 1999.

Wicker, Guy et al., Nonvolatile, High Density, High Performance Phase Change Memory, 1999, http://klabs.org/richcontent/MAPLDCon99/Papers/P21_Tyson_P.PDF#search='nonvolatile%20high%20density%20high%20performance%20phase%20change%20memory', 8 pages.

Wicker, Guy, "A Comprehensive Model of Submicron Chalcogenide Switching Devices," Doctoral Dissertation, Wayne State University, Detroit, MI, 1996.

Wolf, Stanley, Excerpt from: Silicon Processing for the VLSI Era-vol. 4, pp. 674-679, 2004.

Wuttig, Matthias, "Towards a Universal Memory?" Nature Materials, Apr. 2005, pp. 265-266, vol. 4.

Yi, J. H. et al., "Novel Cell Structure of PRAM with Thin Metal Layer Inserted GeSbTe," IEEE IEDM 2003, 4 pages.

Yonehara, T. et al., "Control of Grain Boundary Location by Selective Nucleation Over Amorphous Substrates," Mat. Res. Soc. Symp. Proc., vol. 106, 1998, pp. 21-26.

Ahn, S. J. et al., "Highly Reliable 5nm Contact Cell Technology for 256Mb PRAM," VLSI Technology, Digest of Technical Papers, Jun. 14-16, 2005, pp. 98-99.

Hwang, Y. N. et al., "Full Integration and Reliability Evaluation of Phase-change RAM Based on 0.24µm-CMOS Technologies," 2003 Symposium on VLSI Technology Digest of Technical Papers, pp. 173-174.

* cited by examiner

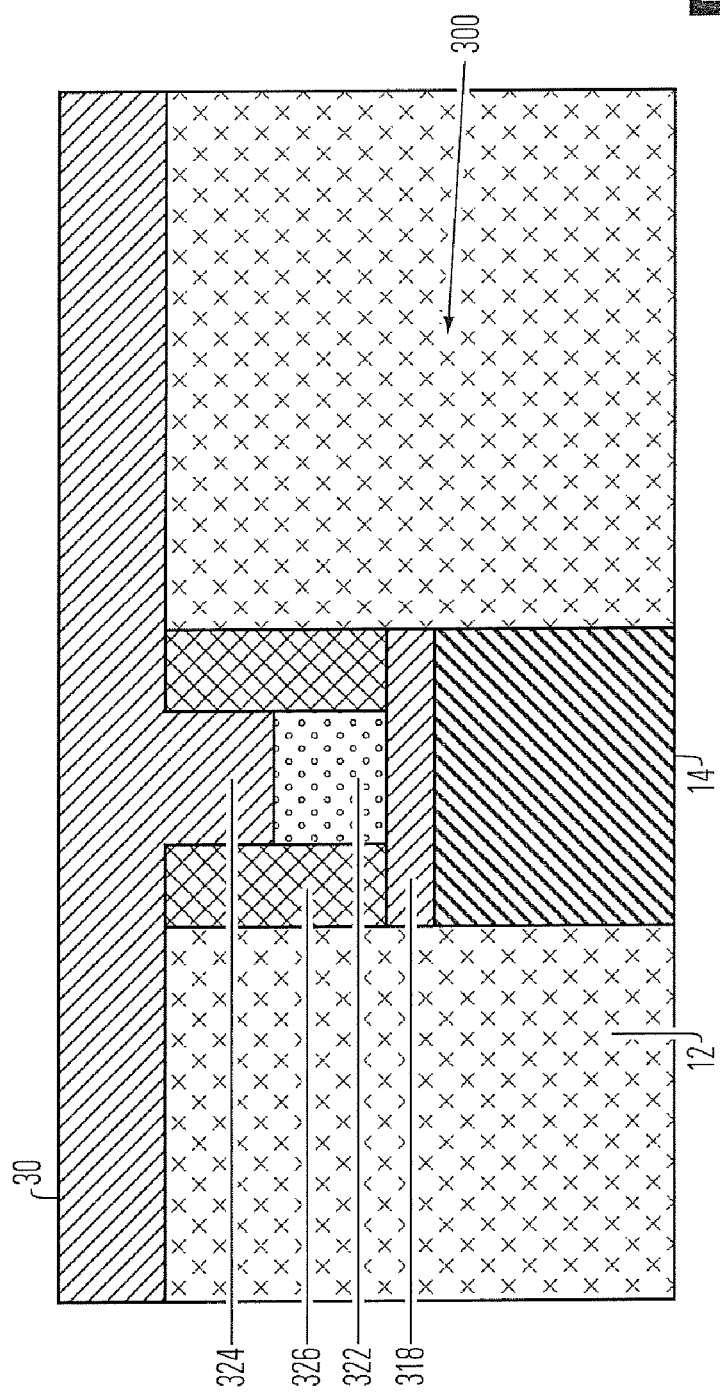

THERMALLY CONTAINED/INSULATED PHASE CHANGE MEMORY DEVICE AND METHOD

REFERENCE TO RELATED APPLICATION

This application is a divisional of currently pending U.S. patent application Ser. No. 11/338,284 filed on 24 Jan. 2006, which application claims the benefit of U.S. Provisional Patent Application No. 60/736,721 filed on 15 Nov. 2005, both of which are incorporated by reference for all purposes.

PARTIES TO A JOINT RESEARCH AGREEMENT

International Business Machines Corporation, a New York corporation; Macronix International Corporation, Ltd., a Taiwan corporation; and Infineon Technologies A.G., a German corporation, are parties to a Joint Research Agreement.

BACKGROUND OF THE INVENTION

1. Field of the Invention

The present invention relates to high density memory devices based on phase change based memory materials, including chalcogenide based materials and other materials, and to methods for manufacturing such devices, and most particularly to a phase change memory element having lowered current and improved heat control characteristics.

2. Description of Related Art

Phase change based memory materials are widely used in nonvolatile random access memory cells. Such materials, such as chalcogenides and similar materials, can be caused to change phase between an amorphous state and a crystalline state by application of electrical current at levels suitable for implementation in integrated circuits. The generally amorphous state is characterized by higher resistivity than the generally crystalline state, which can be readily sensed to indicate data.

The change from the amorphous to the crystalline state is generally a low current operation. The change from crystalline to amorphous, referred to as reset herein, is generally a higher current operation, which includes a short high current density pulse to melt or breakdown the crystalline structure, after which the phase change material cools quickly, quenching the phase change process, allowing at least a portion of the phase change structure to stabilize in the amorphous state. It is desirable to minimize the magnitude of the reset current used to cause transition of phase change material from a crystalline state to amorphous state. The magnitude of the reset current needed for reset can be reduced by reducing the size of the phase change material element in the cell and of the contact area between electrodes and the phase change material, so that higher current densities are achieved with small absolute current values through the phase change material element.

One direction of development has been toward forming small pores in an integrated circuit structure, and using small quantities of programmable resistive material to fill the small pores. Patents illustrating development toward small pores include: Ovshinsky, "Multibit Single Cell Memory Element Having Tapered Contact," U.S. Pat. No. 5,687,112, issued 11 Nov. 1997; Zahorik et al., "Method of Making Chalogenide [sic] Memory Device," U.S. Pat. No. 5,789,277, issued 4 Aug. 1998; Doan et al., "Controllable Ovonic Phase-Change Semiconductor Memory Device and Methods of Fabricating the Same," U.S. Pat. No. 6,150,253, issued 21 Nov. 2000.

A particular problem encountered in the prior art has been controlling the operating current, and the heat generated by that current. The phase change process proceeds by joule heating of the phase change material, which produces two problems. First is controlling the current required by a memory unit that has billions of individual memory cells (as a unit offering storage capacity in the gigabyte range clearly does). Second, the heat generated by that number of cells has the potential at least to degrade a memory unit, if not destroy it altogether.

It is desirable therefore to provide a memory cell structure having a reduced heat profile and low reset current, and a method for manufacturing such structure that meets tight process variation specifications needed for large-scale memory devices. It is further desirable to provide a manufacturing process and a structure, which are compatible with manufacturing of peripheral circuits on the same integrated circuit.

SUMMARY OF THE INVENTION

An aspect of the invention is a memory device with improved heat transfer characteristics. The device first includes a dielectric material layer; first and second electrodes, vertically separated and having mutually opposed contact surfaces. A phase change memory element is encased within the dielectric material layer, including a phase-change layer positioned between and in electrical contact with the electrodes, wherein the lateral extent of the phase change layer is less than the lateral extent of the electrodes. An isolation material is positioned between the phase change layer and the dielectric layer, wherein the thermal conductivity of the isolation material is lower than the thermal conductivity of the dielectric material. The isolation layer isolates the material of the phase change layer from etching processes which may damage or undercut the material. In embodiments described herein, the isolation material also improves thermal isolation of the phase change material.

DETAILED DESCRIPTION

The following detailed description is made with reference to the figures. Preferred embodiments are described to illustrate the present invention, not to limit its scope, which is defined by the claims. Those of ordinary skill in the art will recognize a variety of equivalent variations on the description that follows.

With regard to directional descriptions herein, the orientation of the drawings establish their respective frames of reference, with "up," "down," "left" and "right" referring to directions shown on the respective drawings. Similarly, "thickness" refers to a vertical dimension and "width" to the horizontal. These directions have no application to orientation of the circuits in operation or otherwise, as will be understood by those in the art.

There follows a description of the phase change element and memory cell of the present invention, after which the process for fabricating them are discussed.

Figure 1:
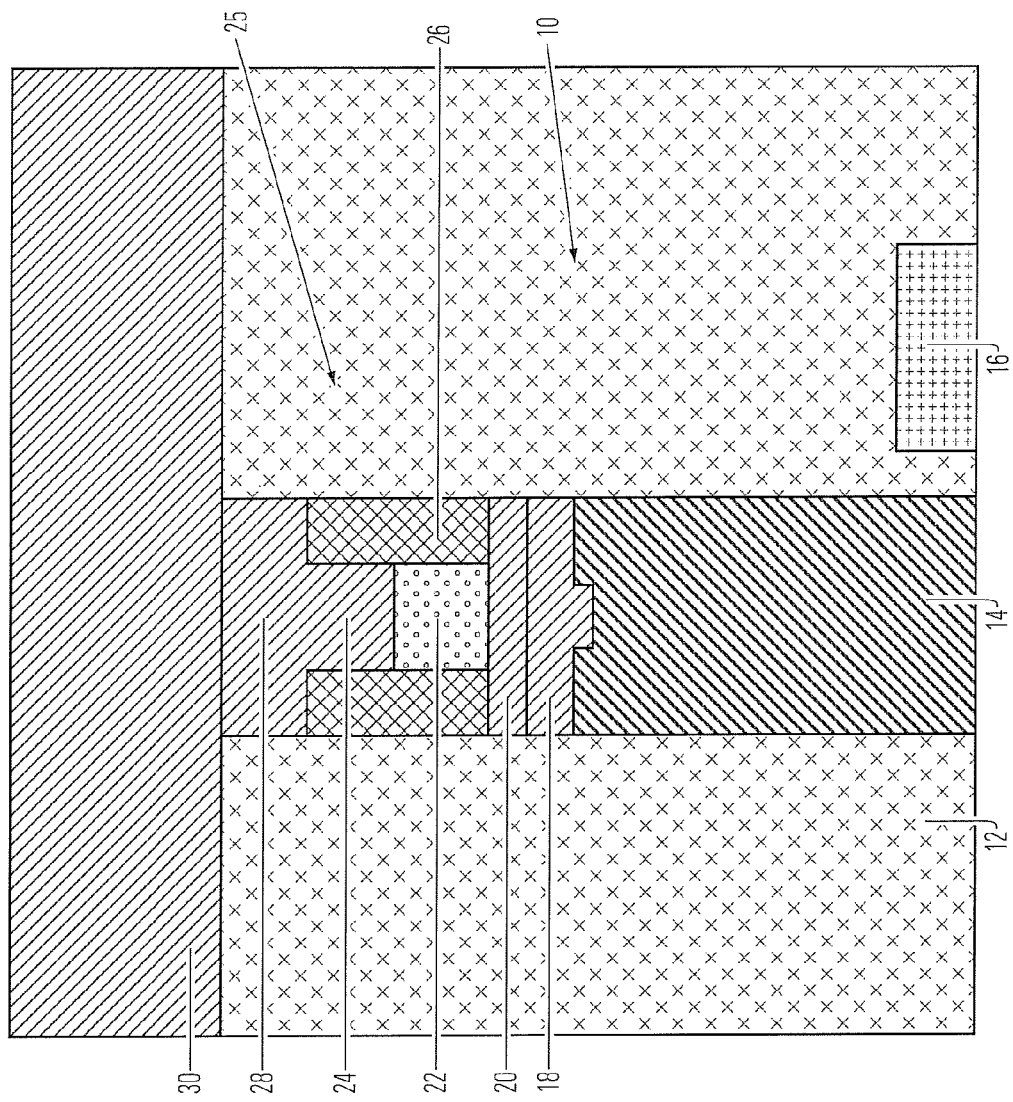
FIG. 1 illustrates the phase change memory element of the present invention.

FIG. 1 depicts phase change memory element 10, an embodiment of the present invention. As seen there, the phase change element extends between two electrodes, a plug element 14 and a top electrode, or bit line, 30. As is known in the art, memory cells are often controlled via two sets of data lines, arranged orthogonally. Word lines are energized to select a specific data word address, while bit lines select a specific bit within that word. Those lines are conventionally laid out in perpendicular arrays. The memory cell of which the present invention is a part can be configured it that layout, with bit line 30 forming the top level of the phase change element, and it is shown extending laterally across the drawing. Word line 16 lies perpendicular to that element. The word line signal connects the plug 14 to a current path used for reading and writing. The conductive material of the plug, bit line and word line can be tungsten, copper, aluminum or other materials and combinations deemed suitable in the art for plug and lines structures generally.

At the upper end of the plug element are formed electrode conductive layer 18 and lower conductive layer 20. The reason for having two such layers is set out more fully below. These layers require three characteristics: First, excellent adhesion to the phase change material discussed below; second, good electrical conductivity; and finally, diffusion barrier characteristics, particularly against diffusion of phase change material into the electrode metals. These layers preferably are made up of TiN or TaN. Alternatively, the conductive layers may be TiAlN or TaAlN, or may comprise, for further examples, one or more elements selected from the group consisting of Ti, W, Mo, Al, Ta, Cu, Pt, Ir, La, Ni, and Ru and combinations thereof. The conductive layers preferably extend across the width of the plug element.

Above the conductive layers 18, 20 is a film of phase change material 22, composed preferably of a chalcogenide. Chalcogens include any of the four elements oxygen (O), sulfur (S), selenium (Se), and tellurium (Te), forming part of group VI of the periodic table. Chalcogenides comprise compounds of a chalcogen with a more electropositive element or radical. Chalcogenide alloys comprise combinations of chalcogenides with other materials such as transition metals. A chalcogenide alloy usually contains one or more elements from group IV of the periodic table of elements, such as germanium (Ge) and tin (Sn). Often, chalcogenide alloys include combinations including one or more of antimony (Sb), gallium (Ga), indium (In), and silver (Ag). Many phase change based memory materials have been described in technical literature, including alloys of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable. The compositions can be characterized as $Te_aGe_bSb_{100-(a+b)}$. One researcher has described the most useful alloys as having an average concentration of Te in the deposited materials well below 70%, typically below about 60% and ranged in general from as low as about 23% up to about 58% Te and most preferably about 48% to 58% Te. Concentrations of Ge were above about 5% and ranged from a low of about 8% to about 30% average in the material, remaining generally below 50%. Most preferably, concentrations of Ge ranged from about 8% to about 40%. The remainder of the principal constituent elements in this composition was Sb. These percentages are atomic percentages that total 100% of the atoms of the constituent elements. (Ovshinsky '112 patent, cols. 10-11.) Particular alloys evaluated by another researcher include $Ge_2Sb_2Te_5$, $GeSb_2Te_4$ and $GeSb_4Te_7$. (Noboru Yamada, "Potential of Ge—Sb—Te Phase-Change Optical Disks for High-Data-Rate Recording", *SPIE* v. 3109, pp. 28-37 (1997).) More generally, a transition metal such as chromium (Cr), iron (Fe), nickel (Ni), niobium (Nb), palladium (Pd), platinum (Pt) and mixtures or alloys thereof may be combined with Ge/Sb/Te to form a phase change alloy that has programmable resistive properties. Specific examples of memory materials that may be useful are given in Ovshinsky '112 at columns 11-13, which examples are hereby incorporated by reference.

Phase change alloys are capable of being switched between a first structural state in which the material is in a generally amorphous solid phase, and a second structural state in which the material is in a generally crystalline solid phase in its local order in the active channel region of the cell. These alloys are at least bistable. The term amorphous is used to refer to a relatively less ordered structure, more disordered than a single crystal, which has the detectable characteristics such as higher electrical resistivity than the crystalline phase. The term crystalline is used to refer to a relatively more ordered structure, more ordered than in an amorphous structure, which has detectable characteristics such as lower electrical resistivity than the amorphous phase. Typically, phase change materials may be electrically switched between different detectable states of local order across the spectrum between completely amorphous and completely crystalline states.

Other material characteristics affected by the change between amorphous and crystalline phases include atomic order, free electron density and activation energy. The material may be switched either into different solid phases or into mixtures of two or more solid phases, providing a gray scale between completely amorphous and completely crystalline states. The electrical properties in the material may vary accordingly.

Phase change alloys can be changed from one phase state to another by application of electrical pulses. It has been observed that a shorter, higher amplitude pulse tends to change the phase change material to a generally amorphous state. A longer, lower amplitude pulse tends to change the phase change material to a generally crystalline state. The energy in a shorter, higher amplitude pulse is high enough to allow for bonds of the crystalline structure to be broken and short enough to prevent the atoms from realigning into a crystalline state. Appropriate profiles for pulses can be determined, without undue experimentation, specifically adapted to a particular phase change alloy. In following sections of the disclosure, the phase change material is referred to as GST, and it will be understood that other types of phase change materials can be used. A material useful for implementation of a PCRAM described herein is $Ge_2Sb_2Te_5$.

Other programmable resistive memory materials may be used in other embodiments of the invention, including $N_2$ doped GST, $Ge_xSb_y$, or other material that uses different crystal phase changes to determine resistance; $Pr_xCa_yMnO_3$, PrSrMnO, $ZrO_x$, or other material that uses an electrical pulse to change the resistance state; TCNQ, PCBM, TCNQ-PCBM, Cu-TCNQ, Ag-TCNQ, $C_{60}$-TCNQ, TCNQ doped with other metal, or any other polymer material that has bistable or multi-stable resistance state controlled by an electrical pulse.

The phase change layer 22 of the embodiment shown in FIG. 1 is a film, preferably having a thickness of from about 10 nm to about 100 nm, most preferably about 40 nm.

Above the phase change layer 22 lies a second conductive layer 24, at least covering the upper surface of the phase change layer. This conductive layer can also formed of TiN, as discussed above. It is convenient to refer to the phase change layer 22 and second conductive layer 24 jointly, which unit hereafter will be referred to as the phase change core 25.

In one embodiment of the invention, the phase change core does not extend completely across the surface of the conductive material. Rather, the phase change material and conductive layer are encased or surrounded by an isolation material 26. In preferred embodiment, the isolation material has a low thermal conductivity relative to the surrounding dielectric fill 12.

An upper conductive layer 28, formed of TiN or similar material, as discussed above, lies atop the second conductive layer/isolation assemblage. An embodiment of the invention constructs the plug and subsequently overlying layers as a generally pillar-like structure. As will be seen below, that design allows for efficient fabrication. Bit line 30 lies above and in contact with the upper conductive layer 28, and it is formed of a suitable metal, as discussed above.

Surrounding and encasing the entire phase change memory element 10 is a dielectric fill material 12. The material preferably consists of one or more layers of silicon oxide or a well-known alternative thereto, such as a silicon oxynitride, doped silicon oxides, polyimide, silicon nitride or other dielectric fill material.

In operation, a current path exists between the plug 14 and bit line 30. In one embodiment, current flows from the bit line, through the phase change element and out through the plug element, but that direction could be reversed in other embodiments. As the current flows though the phase change material, joule heating causes the temperature of the phase change material to rise, and, as explained above, based on the length and amplitude of the current pulse, the element can be placed in a SET or RESET condition. If it is desired only to read the state of the phase change material, a relatively lower current pulse is employed, sufficient to determine the resistance of the material. The isolation layer in embodiments in which it comprises a material with relatively low thermal conductivity, reduces the heat conduction away from the phase change material, and thus keeps its temperature at a higher level. Thus, greater heating is achieved for each unit of current, which allows for faster response time, lower current usage and lower overall heating of the unit.

Figure 2:
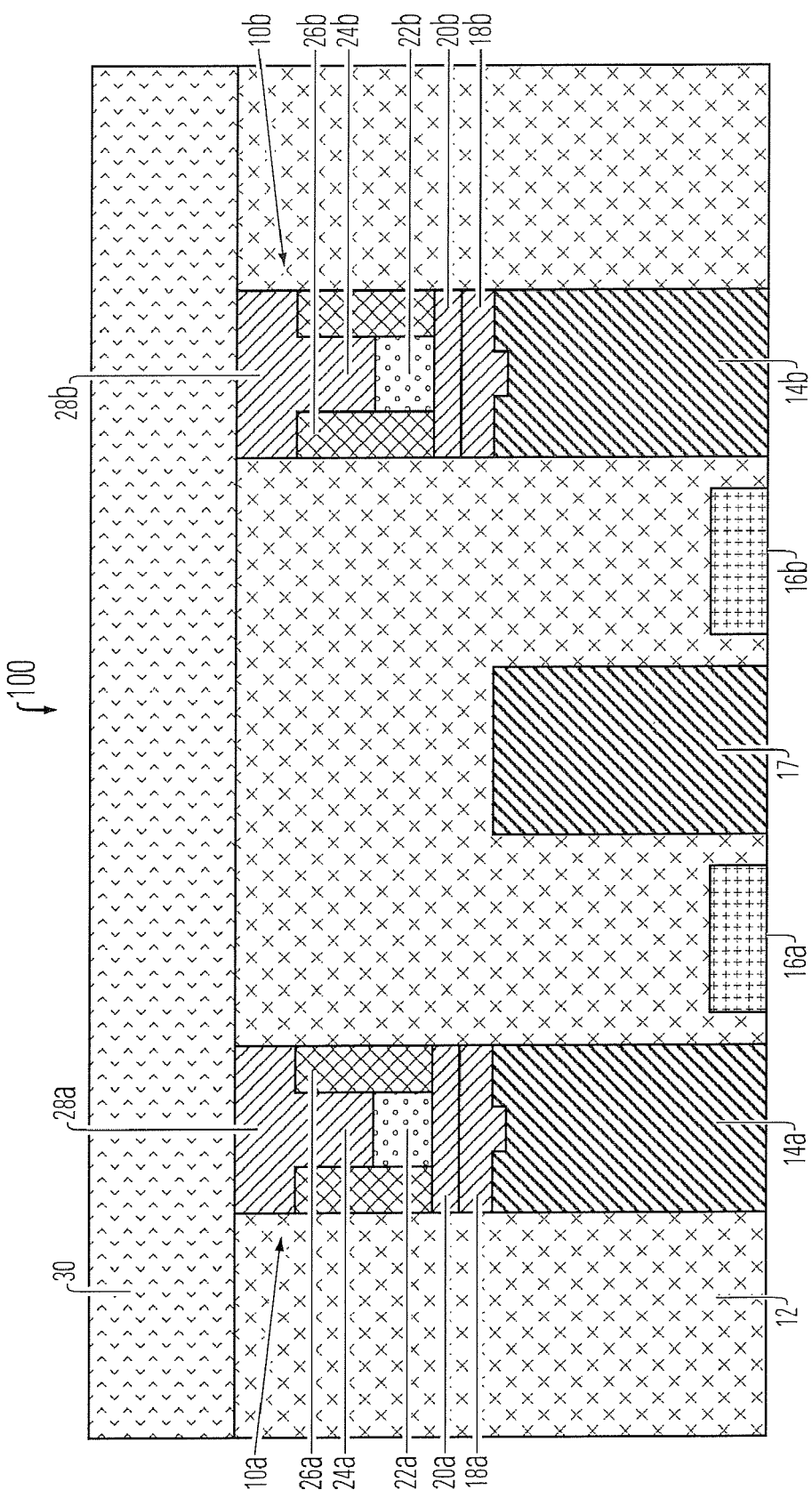
FIG. 2 illustrates a random access memory cell including a phase change memory element of the present invention.

Control of access to the memory cell is provided by control elements, preferably access transistors (not shown). An alternate circuit configuration could employ diodes or similar devices. FIG. 2 illustrates a preferred arrangement, in which two memory elements, 10a and 10b in a column share a common source terminal 17. As can be seen, each of the memory elements is identical in structure to memory element 10 discussed above, including conductive layers 18a/18b, 20a/20b and 24a/24b; phase change layers 22a/22b; and isolation elements 26a/26b. Bit line 30 makes contact with the upper conductive layers 28a and 28b of both elements, and each element has an associated word line 16a/16b disposed close thereto and connected via appropriate circuitry (not shown). A common source line 17 runs through the cell, providing a current path to the sources of the access transistors (not shown).

In order to write to memory element 10b, for example, appropriate enabling signals would be fed to bit line 30 and word line 16b. As a result, current would flow in the memory cell 10b, from bit line 30, through, through the conductive layers 28b and 24b, and into the phase change layer 22b. There, the current would produce heating, which in turn would cause the material to assume either the crystalline or amorphous phase, based on the amplitude and duration of the current pulse. Reading the memory element would proceed by passing a low level current pulse though the element, sensing the resistance of the phase change element. Current flow proceeds through conductive layers 20b and 18b, plug element 14b, through the underlying control circuitry and into common source line 17.

Figure 3:
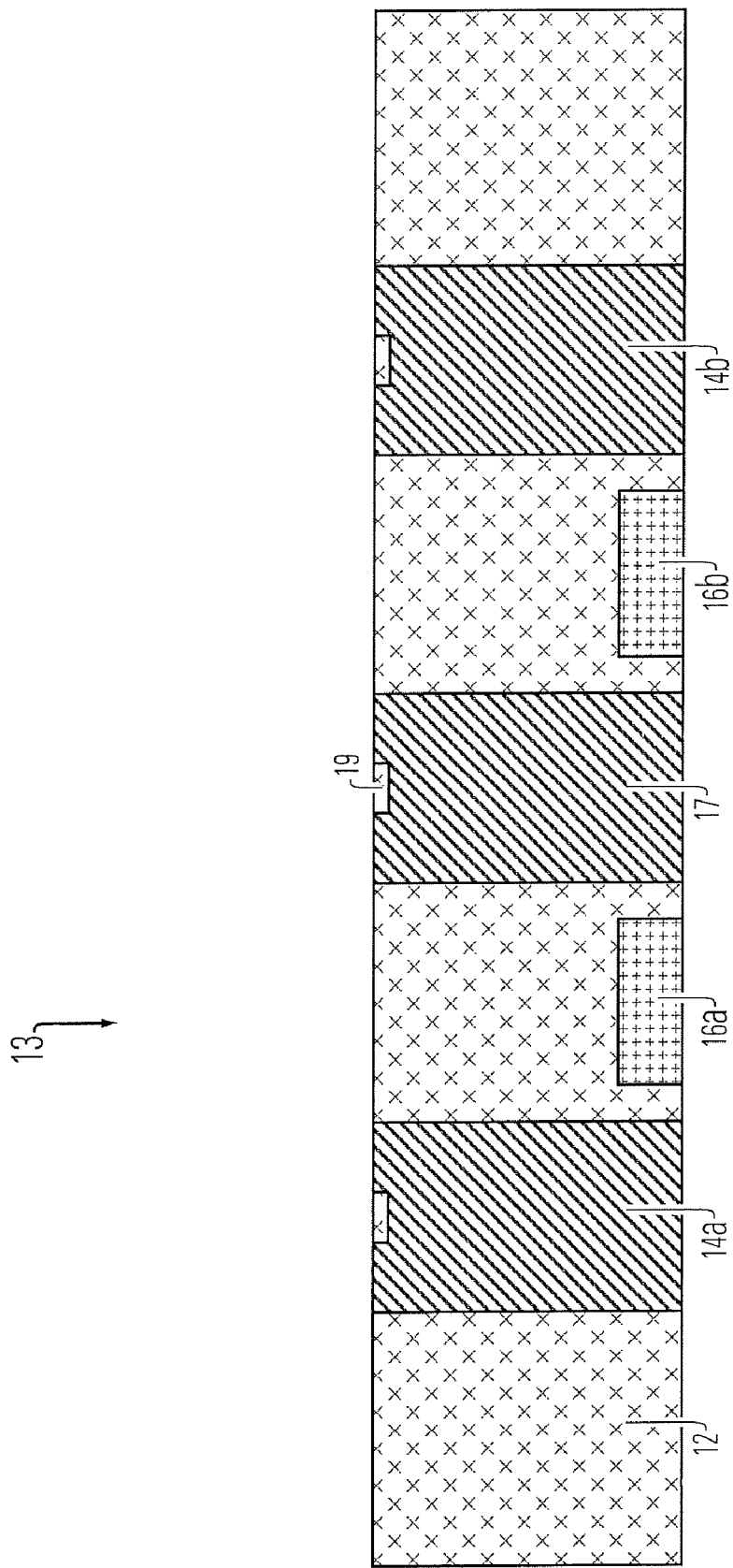
FIG. 3 illustrates an initial step in the fabrication of the random access memory cell of the present invention.

A starting point for fabrication of the device of the present invention is seen in FIG. 3, showing a point in the fabrication process following the formation of a substrate 13, consisting of dielectric material 12 and associated features, primarily the plug elements 14a and 14b, word lines 16a and 16b, and source line 17. Doped regions in the semiconductor substrate (not shown to simplify the drawing) act as terminals of transistors including the word lines 16a and 16b as gates for coupling the plugs 14a, 14b to the common source line 17. These elements are preferably formed in conventional manner, preferably involving deposition of the oxide layer, patterning and etching of the same, and further deposition of the metal elements.

A significant problem in the fabrication of phase change elements is the fact that when a metal plug is formed using conventional methods, which most often is chemical vapor deposition or some variant thereof, the deposition pattern typically results in a low area, or dimple, at the center of the plug. Dimple 19, shown in FIG. 3, illustrates that problem. Because a deposited layer generally follows the contour of the surface on which it is deposited, the next layer will unavoidably exhibit some topology, which could easily lead to adhesion or peeling problems. That problem is particularly acute regarding either a directly-applied phase change layer or a phase change layer applied to an intermediate layer.

Figure 4:
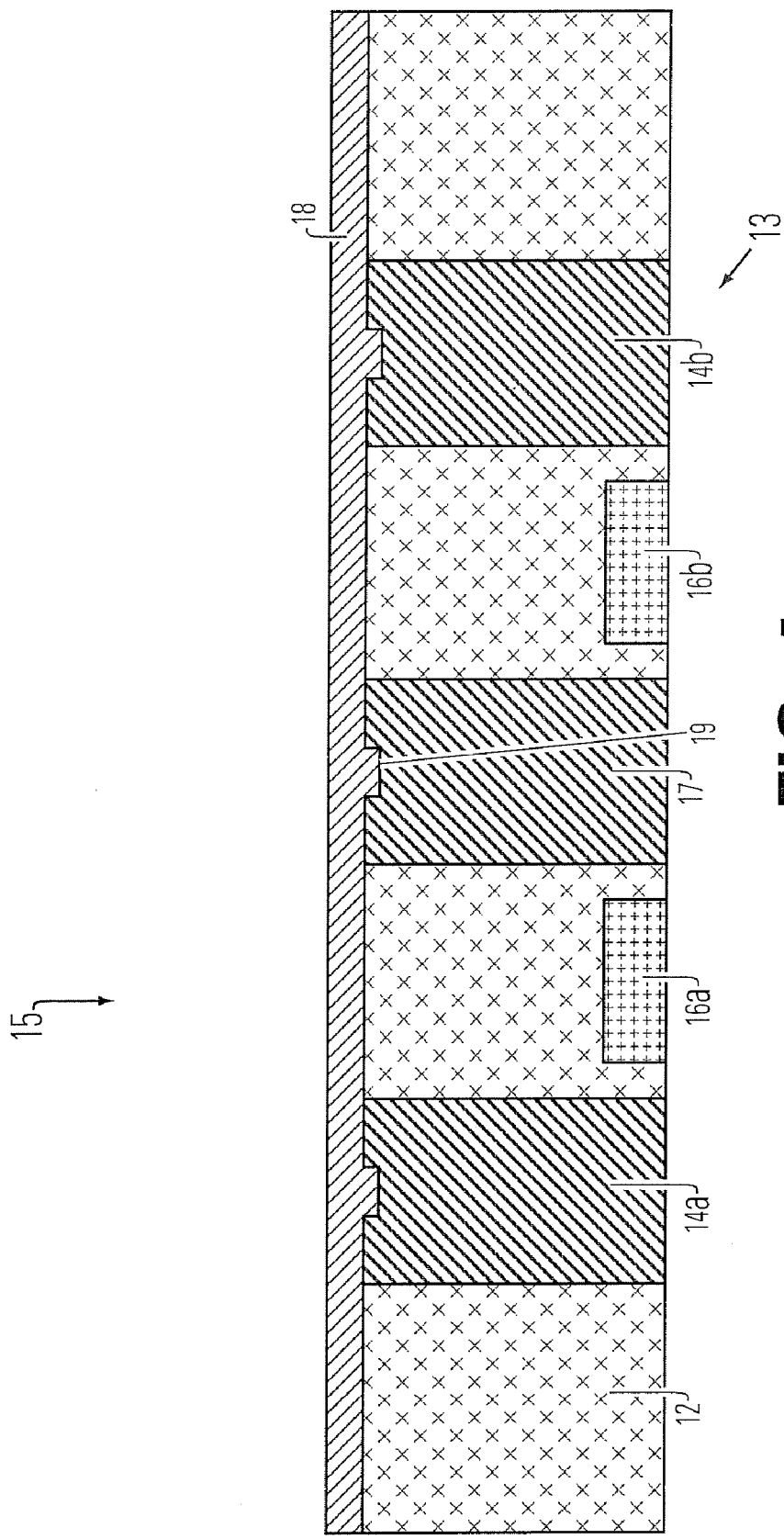
FIG. 4 illustrates a further step in the fabrication of the random access memory cell of the present invention.

A solution to that problem is presented in FIG. 4, which illustrates the formation of a base element 15, in which electrode conductive layer 18 is deposited over the substrate 13. After deposition, the conductive layer is planarized, preferably employing chemical-mechanical polishing (CMP), to provide a perfectly planar surface on which to build the remainder of the structure.

Figure 5:
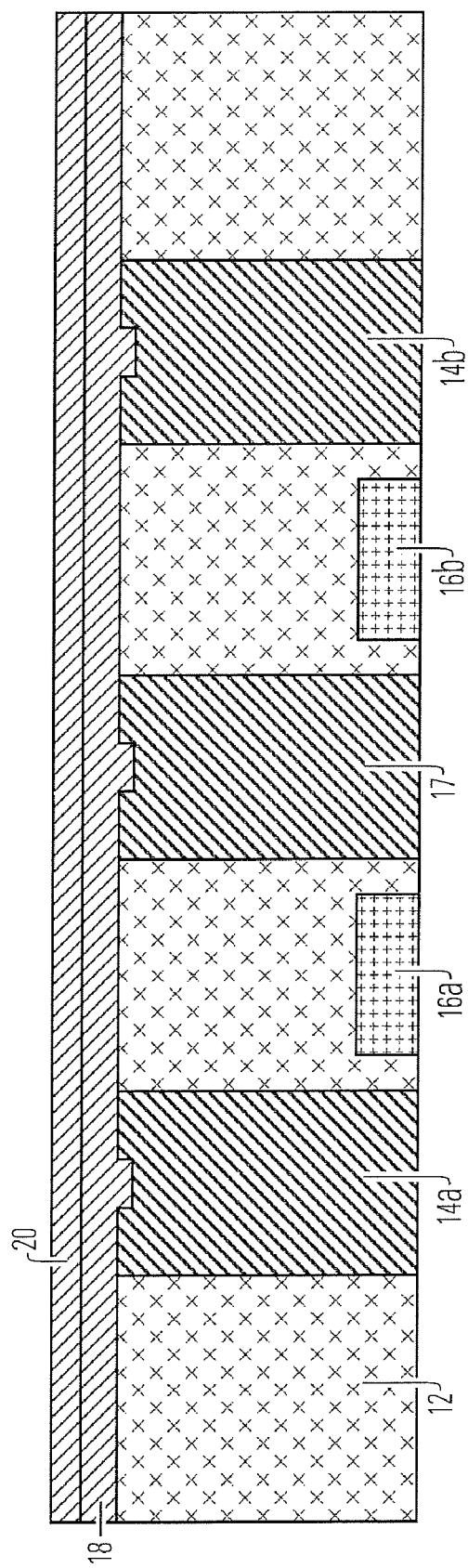
FIG. 5 illustrates a further step in the fabrication of the random access memory cell of the present invention.
Figure 6:
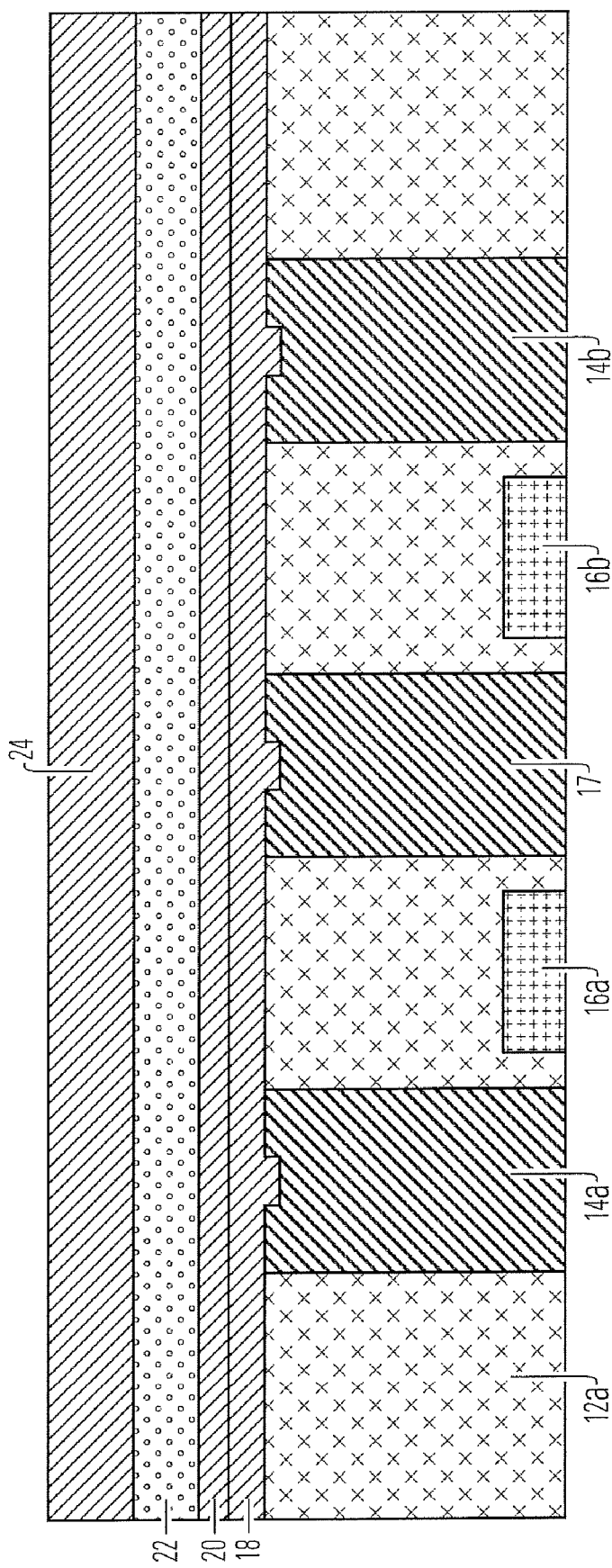
FIG. 6 illustrates a further step in the fabrication of the random access memory cell of the present invention.

FIG. 5 depicts the results of the next process step, in which a lower conductive layer 20 is formed on the electrode conductive layer 18. FIG. 6 takes the process to the next steps, the deposition of the phase change material 22 and the second conductive layer 24. Each of these layers may be formed by chemical vapor CVD, or physical vapor deposition (PVD) or a variant thereof. These layers can be from about 10 to about 300 nm thick. The preferred thickness in one embodiment of the invention is 50 nm. The second conductive layer may be formed of TiN or a variant thereof, as discussed above. It is preferred to employ in-situ deposition techniques in depositing layers 20, 22 and 24. That is, the structure is not removed from the processing chamber, nor is that chamber opened between steps, Maintaining the low-pressure processing atmosphere provides an improved interface and bonding between these layers, likewise improving the quality of the device. For this process it is most preferable to employ a PVD sputtering process. An embodiment of the invention further varies the makeup of this element by employing polysilicon, and another embodiment employs tungsten. Those in the art will understand the use of such conventional materials in this application. It is preferred to employ two TiN layers, as shown. The first such layer, after planarization, offers an excellent flat surface for succeeding layers. In one embodiment, the lower conductive layer and the phase change material layer are deposited using PVD cluster tooling equipment, which provides for improved adhesion and deposition characteristics.

Figure 7:
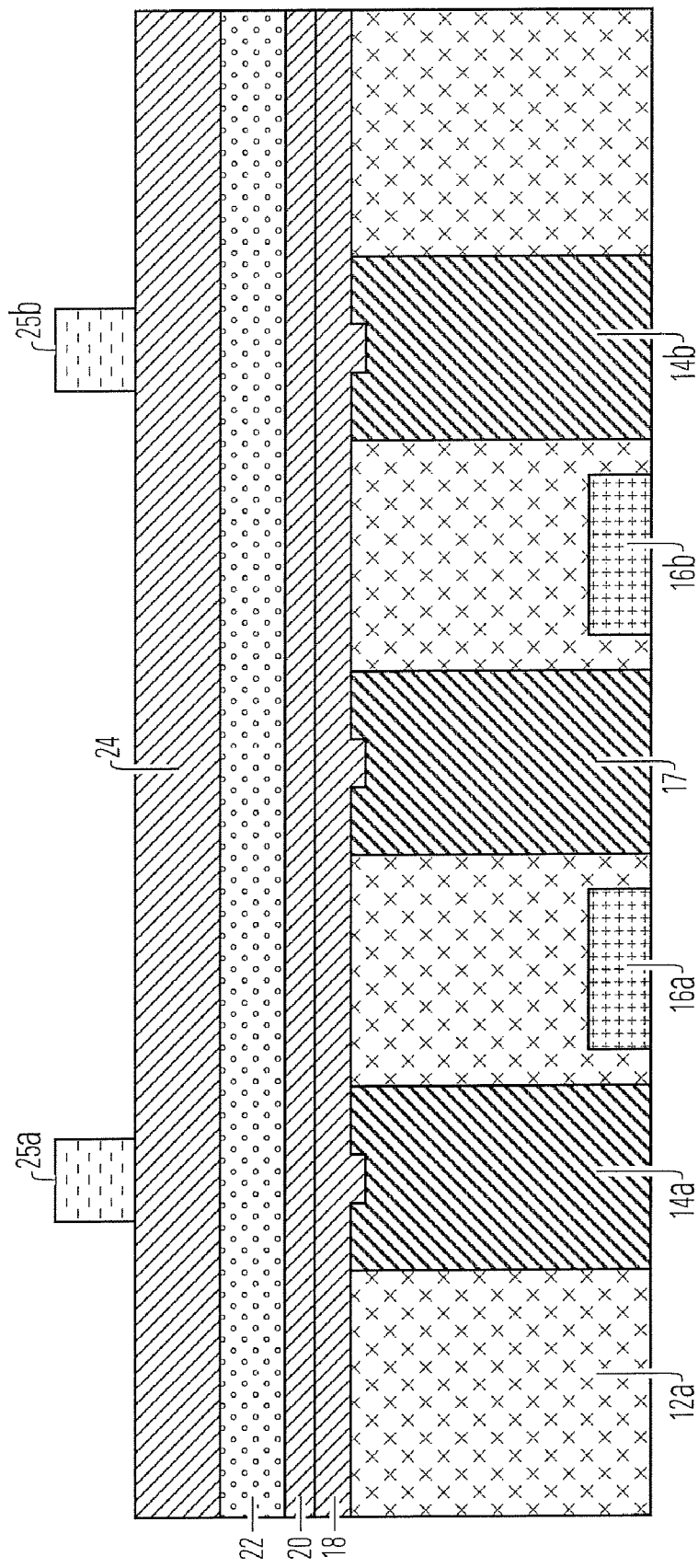
FIG. 7 illustrates a further step in the fabrication of the random access memory cell of the present invention.

Next, the layers of material are converted into separate memory elements by a series of lithographic patterning steps. First, seen in FIG. 7, mask elements 25a and 25b are formed on second conductive layer 24. That is accomplished by the known process of depositing a photoresist material on the structure, exposing the photoresist using a reticle or mask, and stripping away the unexposed portion of resist material to leave the mask elements. If the dimension of the masks is less than the minimum feature size of the lithographic process in use, the mask elements may be deposited conventionally and then trimmed, by timed etching, preferably dry etching of the resulting masks, employing a reactive ion etching (RIE) tool, based on oxygen plasma chemistry.

Figure 8:
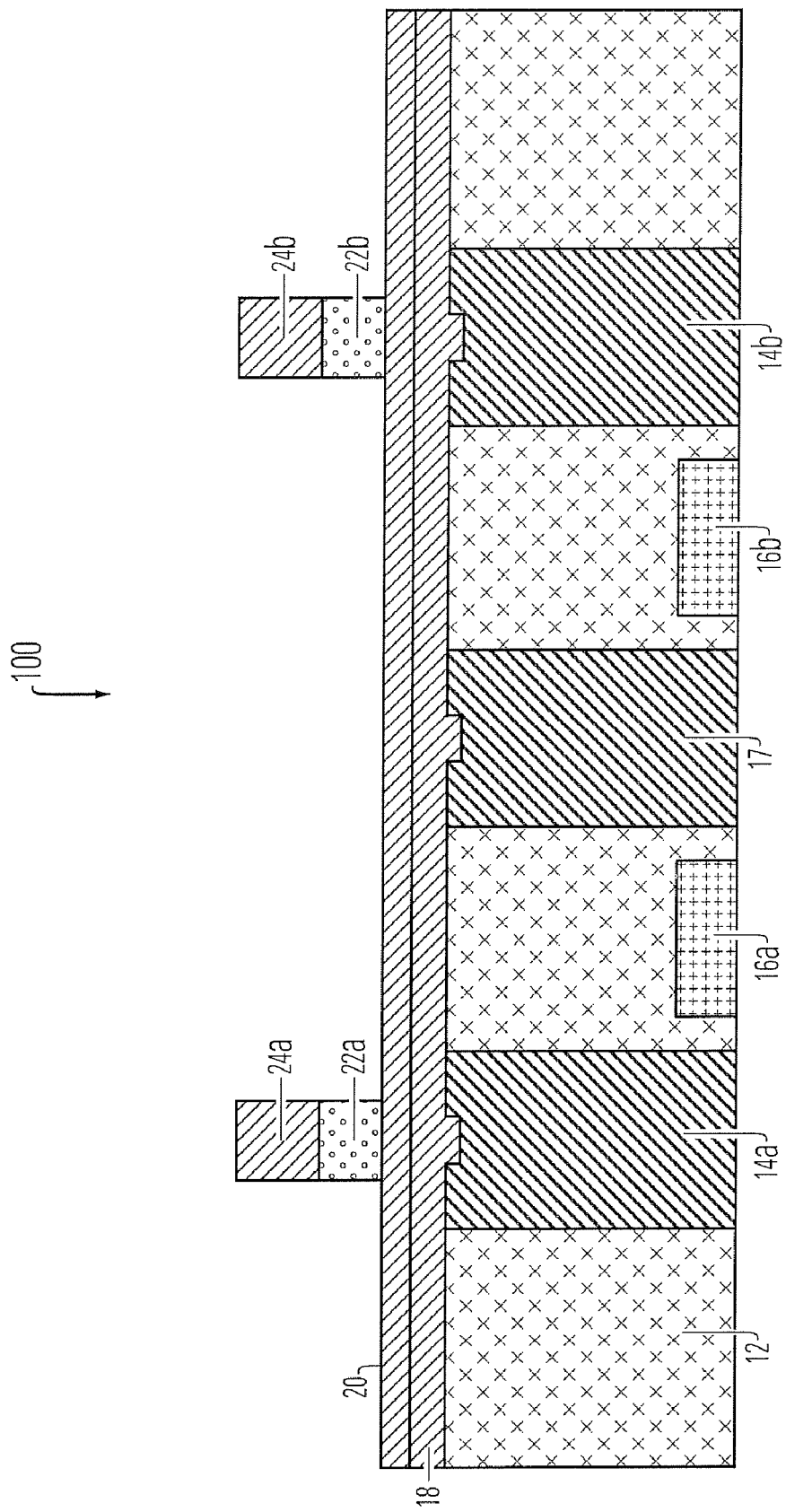
FIG. 8 illustrates a further step in the fabrication of the random access memory cell of the present invention.

Next, as seen in FIG. 8, the mask element is used to perform an etching process to remove the portions of the second conductive layer and phase change layer not under a mask element. The etching process should be conducted to stop when reaching the lower conductive layer 20. An etching process employed in one embodiment is a dry anisotropic etch using a RIE, utilizing argon fluorine or oxygen plasma chemistry. An optical emission tool may be used to identify and control the end point of the etch, when the TiN layer is encountered.

Figure 9:
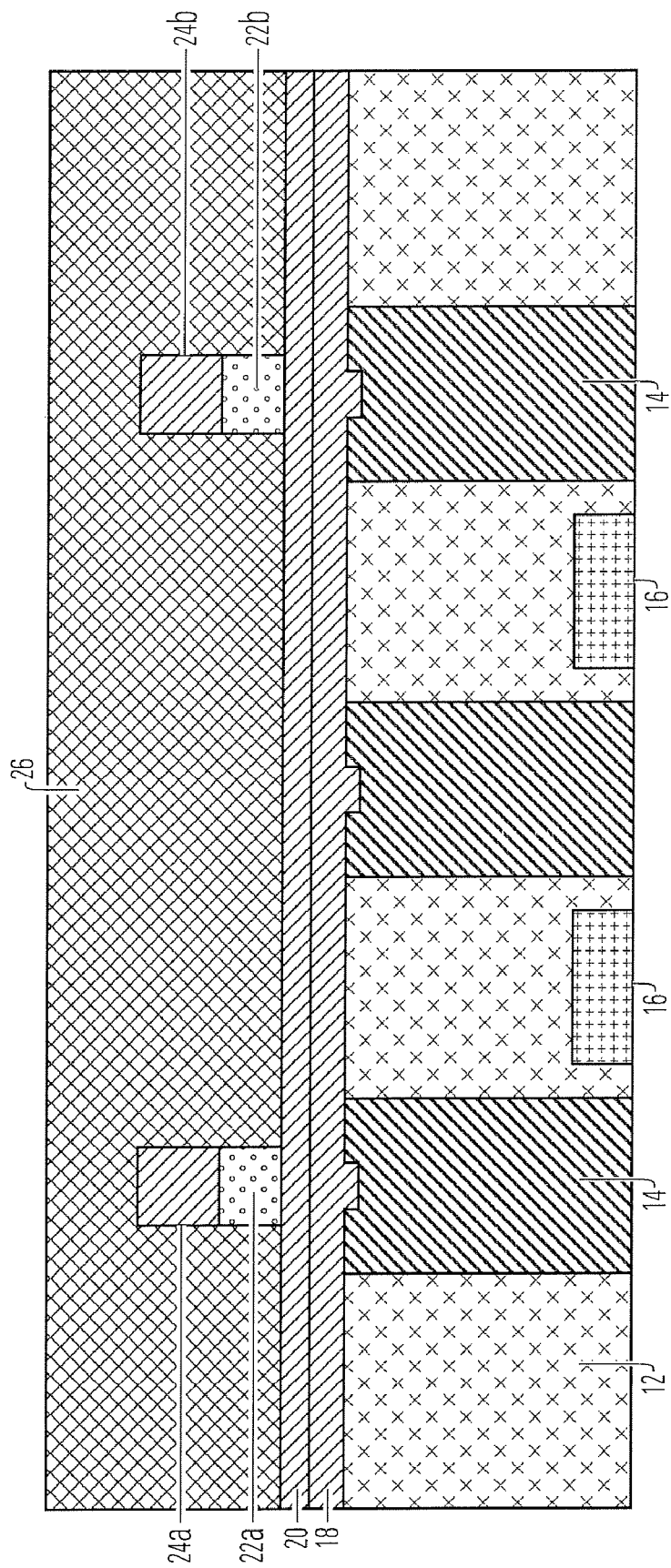
FIG. 9 illustrates a further step in the fabrication of the random access memory cell of the present invention.

Having removed the phase change material and excess TiN in the second conductive layer, FIG. 9 shows a layer of isolation material 26 deposited over the structure of FIG. 8.

Representative materials for the layer of isolation material include materials that are a combination of the elements silicon Si, carbon C, oxygen O, fluorine F, and hydrogen H. Silicon nitride or other materials having higher thermal conductivity than $SiO_2$ may be used when thermal conductivity is not critical. Examples of thermally insulating materials which are candidates for use for the thermally insulating isolation layer include $SiO_2$, SiCOH, polyimide, polyamide, and fluorocarbon polymers, selected so that the material has a lower thermal conductivity that the dielectric fill layer to be deposited over it. When the overlying material is $SiO_2$, the thermally insulating material should have a thermal conductivity less than that of $SiO_2$, or less than about 0.014 J/cm*degK*sec. Many low-K materials, where low-K materials have permittivity less that that of $SiO_2$, are suitable isolations. Examples of materials which are candidates for use for the thermally insulating isolation layer include fluorinated $SiO_2$, silsesquioxane, polyarylene ethers, parylene, fluoro-polymers, fluorinated amorphous carbon, diamond like carbon, porous silica, mesoporous silica, porous silsesquioxane, porous polyimide, and porous polyarylene ethers. A single layer or combination of layers can provide thermal isolation.

Figure 10:
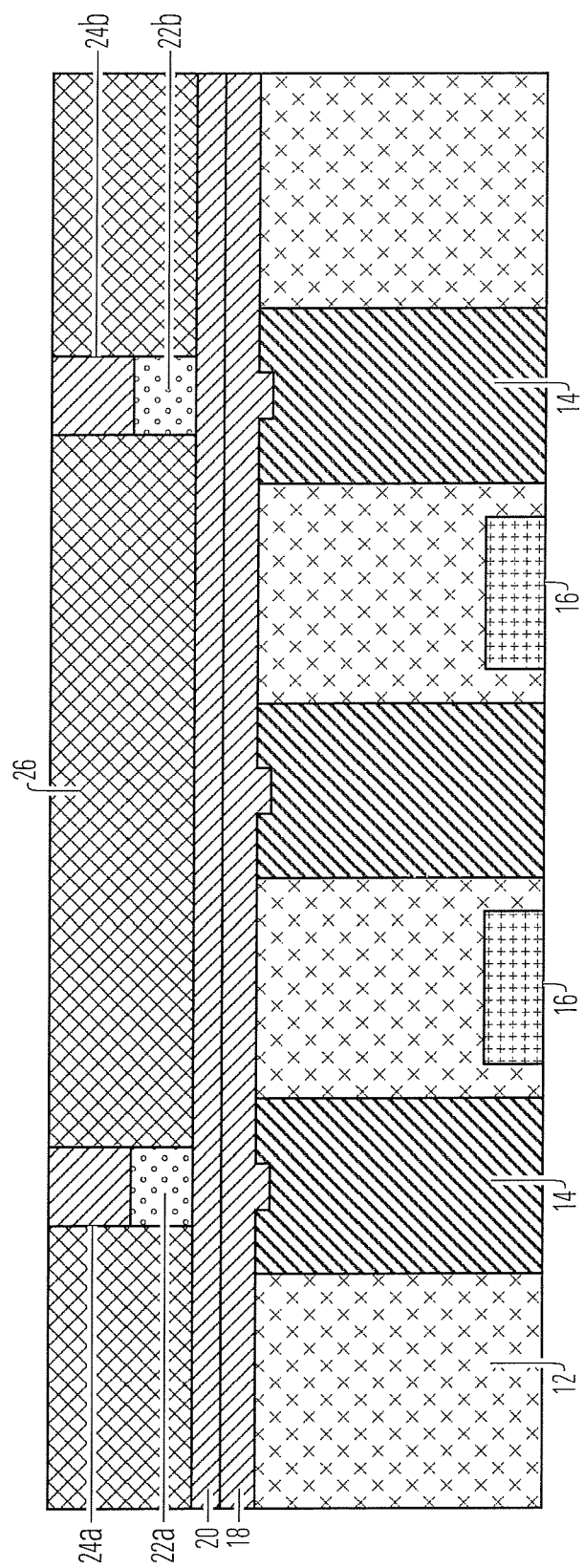
FIG. 10 illustrates a further step in the fabrication of the random access memory cell of the present invention.
Figure 11:
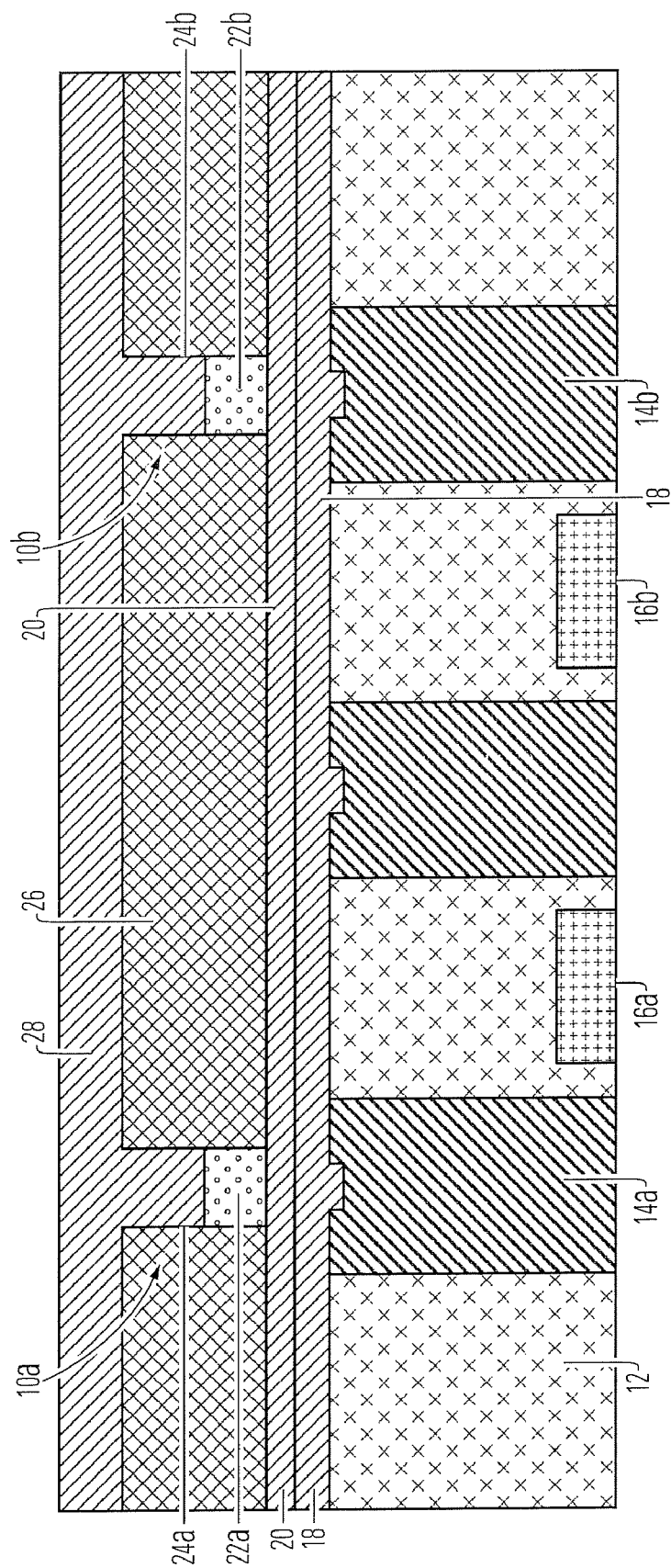
FIG. 11 illustrates a further step in the fabrication of the random access memory cell of the present invention.

Alternative embodiments employ a second phase change material for this isolation layer, differentiated from the layer 22 in being highly doped, with dopants such as silicon, oxygen or nitrogen. Given these criteria, those in the art can choose from these and other known materials to create an effective isolation layer. This deposition is continued to a depth exceeding that of the two phase change material/conductive layer structures of 22a/24a and 22b/24b. That structure is planarized, as shown in FIG. 10, preferably employing a CMP process, to expose the upper surfaces of second conductive layers 24a and 24b. Planarization is followed by deposition of upper conductive layer 28, as reflected in FIG. 11. This layer is preferably formed of TiN or other suitable materials, as discussed in connection with other conductive layers.

Figure 12:
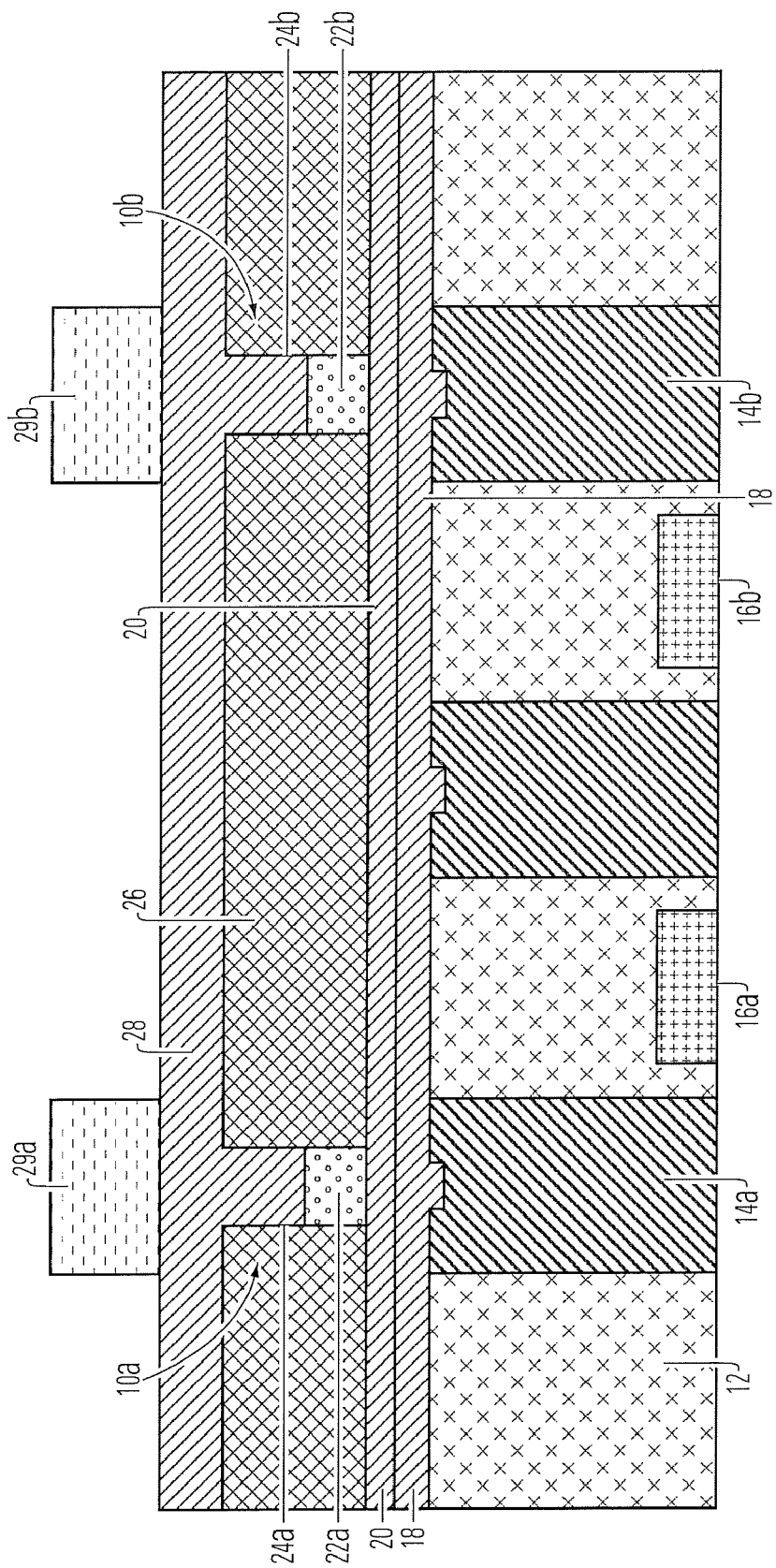
FIG. 12 illustrates a further step in the fabrication of the random access memory cell of the present invention.
Figure 13:
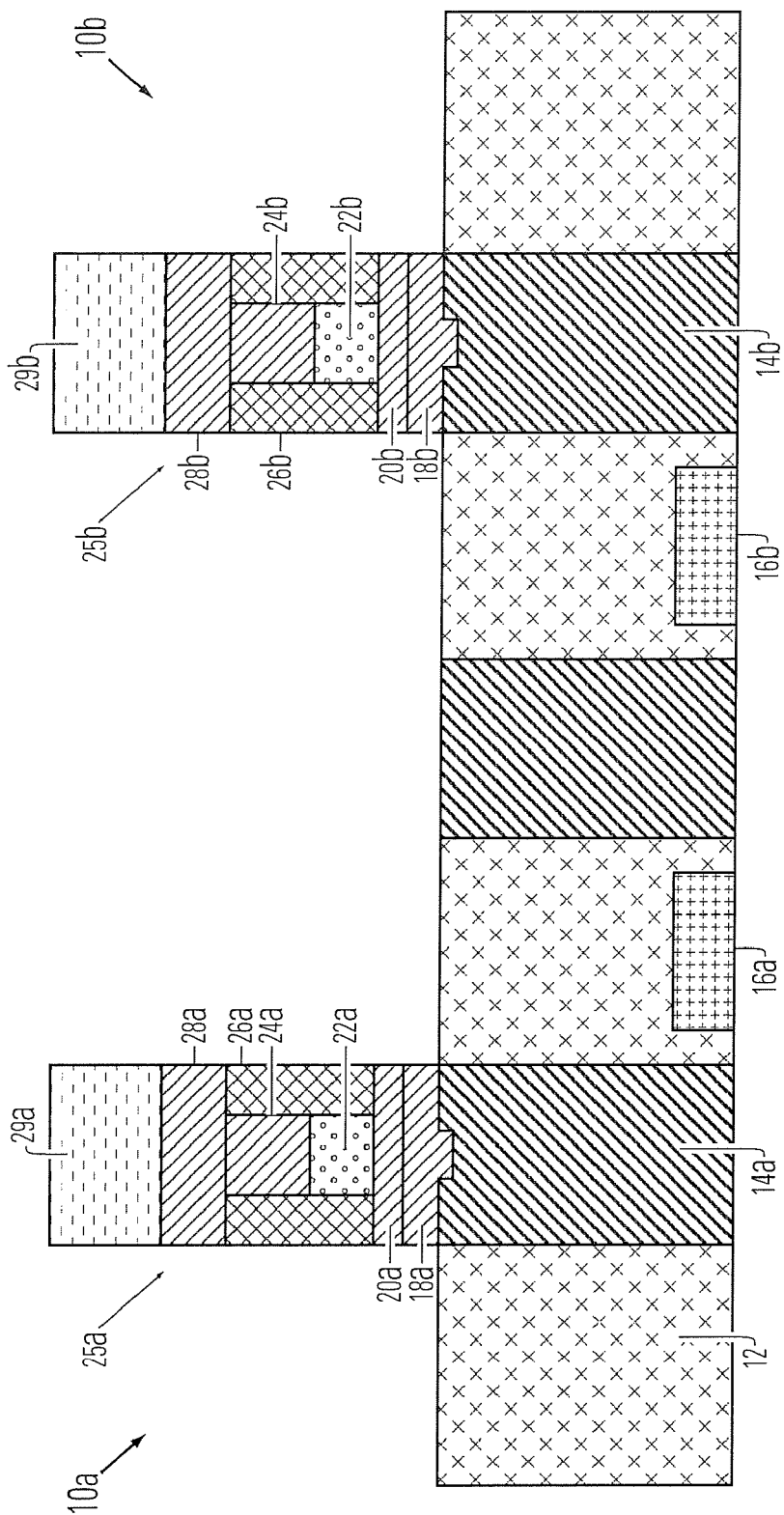
FIG. 13 illustrates a further step in the fabrication of the random access memory cell of the present invention.

The process of defining and isolating phase change memory elements 10a and 10b proceeds in FIGS. 12 and 13. As seen in FIG. 12, a layer of photoresist is deposited on the top surface of the upper conductive layer 28. The layer is patterned and etched to define photoresist films 29a and 29b. The films are formed to have a width equal to the desired width of the eventual phase change memory elements. The patterning step is followed by etching the layers exposed by the photoresist films, as seen in FIG. 13, down to the level of the dielectric fill 12. This etching leaves two isolated structures, phase change memory elements 10a and 10b, each having an electrode and lower conductive layer 18a/18b and 20a/20b, in contact with plug element 14a/14b, and phase change material 22a/22b on the upper surface of the lower conductive layer, with a second conductive layer 24a/24b above the same, the two of which form phase change core 25a/25b. An upper conductive layer 28a/28b is in contact with the second conductive layer, and both the upper conductive layer and the lower/electrode conductive layer stack extend laterally beyond the phase change core. Into the space between the upper conductive layer and lower conductive layer there extend layers of isolation material 26a/26b encasing the phase change core on both sides. That structure is defined by the etching step, which preferably is a dry anisotropic etch, which in one embodiment is preferably accomplished with a reactive ion etching (RIE) tool. It is preferred to employ argon, fluorine or chlorine for this etching. Most preferably, a chlorine chemistry is employed for the TiN layer, followed by a switch to fluorine chemistry.

Here it should be noted that a preferred isolation material 26 serves not only to provide reduced heat transfer, as discussed above, but during the etching process it also protects the phase change material from action of the etchant. Otherwise, the etching could produce undercutting of the phase change material. The design shown here precludes that result.

After etching the phase change and conductive layers, the photoresist is stripped. It is preferred to strip the photoresist, rather than leaving it in place, as the polymer material of the photoresist can be degraded in subsequent steps, producing organic waste material that can be difficult to deal with. The preferred stripping method employs $O_2$ plasma, which can be followed by a wet-strip using a suitable solvent, such as EKC265, to assist performance. These processes and their employment are well known in the art.

Figure 14:
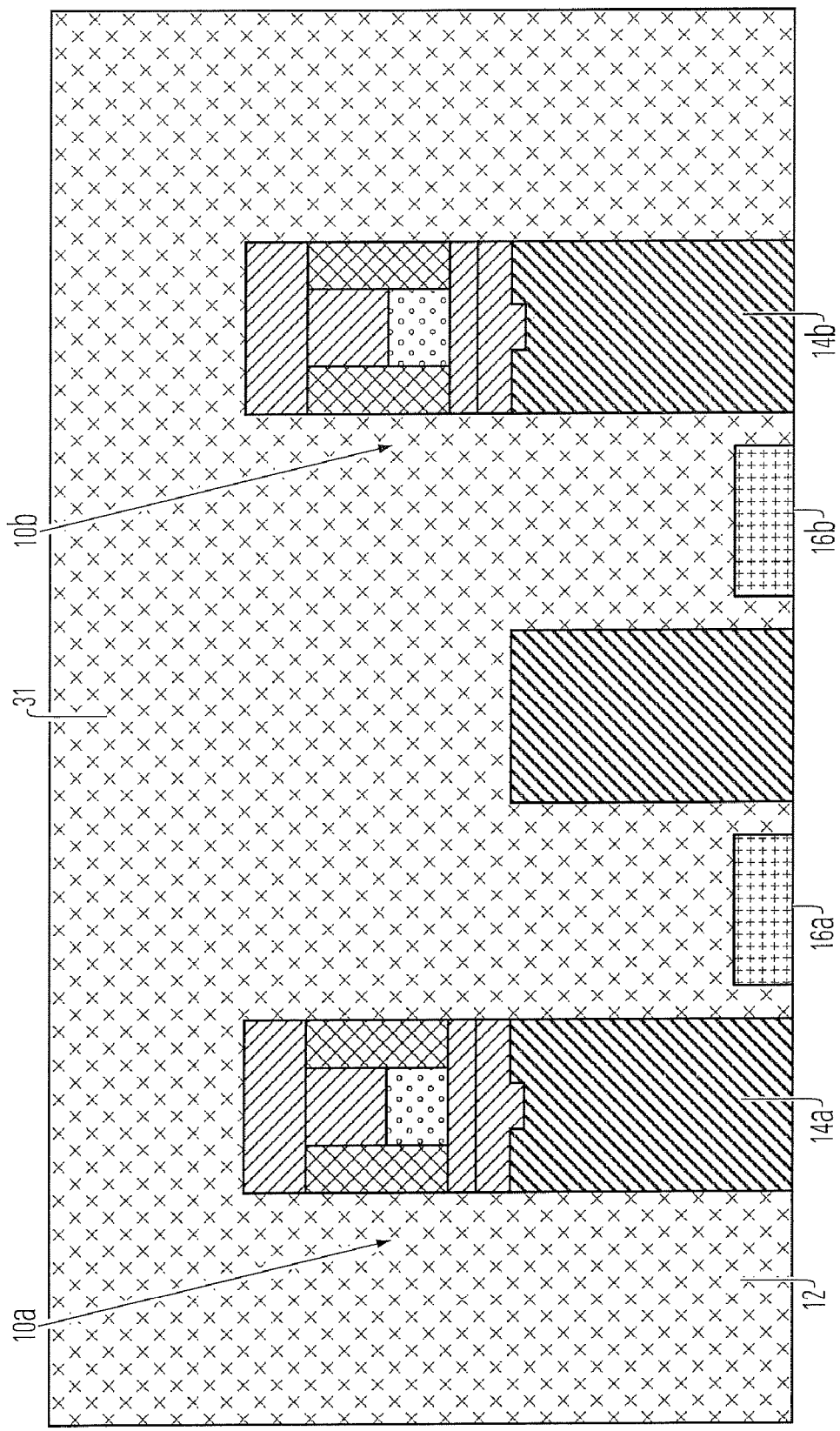
FIG. 14 illustrates a further step in the fabrication of the random access memory cell of the present invention.
Figure 15:
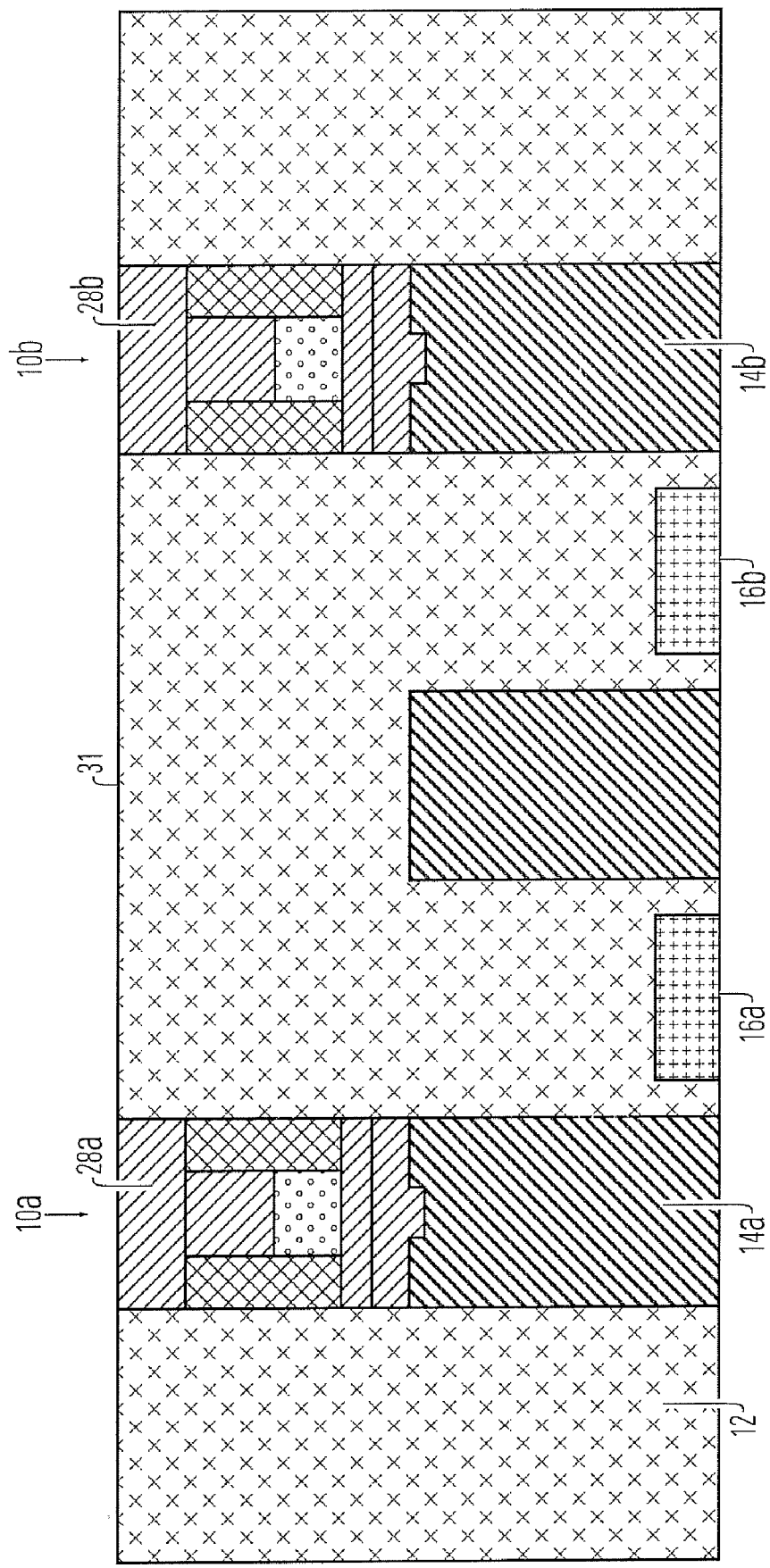
FIG. 15 illustrates a further step in the fabrication of the random access memory cell of the present invention.

The final steps in the process, generally aimed at producing a finished integrated circuit product, are seen in FIGS. 14 and 15. First, a deep layer of dielectric fill material 31 is formed, extending from the upper surface of the former dielectric fill layer 12, to a level above both phase change memory elements 10a and 10b. It is preferred to employ the same material in this layer as was employed in forming layer 12, but those in the art will understand that it may be advantageous to employ a different material, and those persons will also understand the range of choices available.

Following the dielectric deposition, the dielectric layer 31 is planarized to a level that exposes the upper surfaces of the upper conductive layers 28a and 28b, as seen in FIG. 15. A CMP process, as known in the art, is preferred for this operation. Then, as shown in FIG. 1, bit line 30 is formed of a suitable metal, as discussed above.

Figure 16:
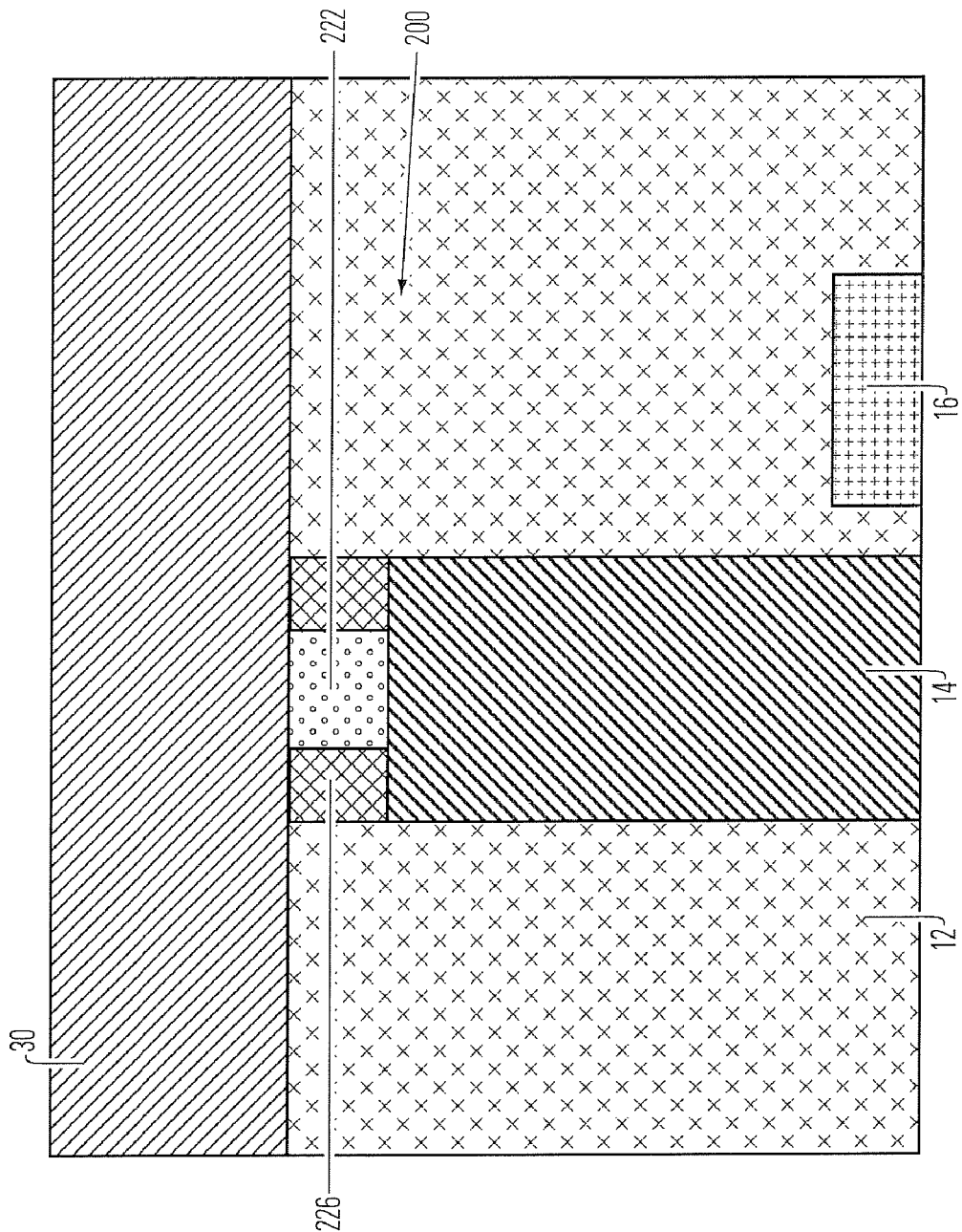
FIG. 16 illustrates an alternative embodiment of the random access memory cell of the present invention.
Figure 17:
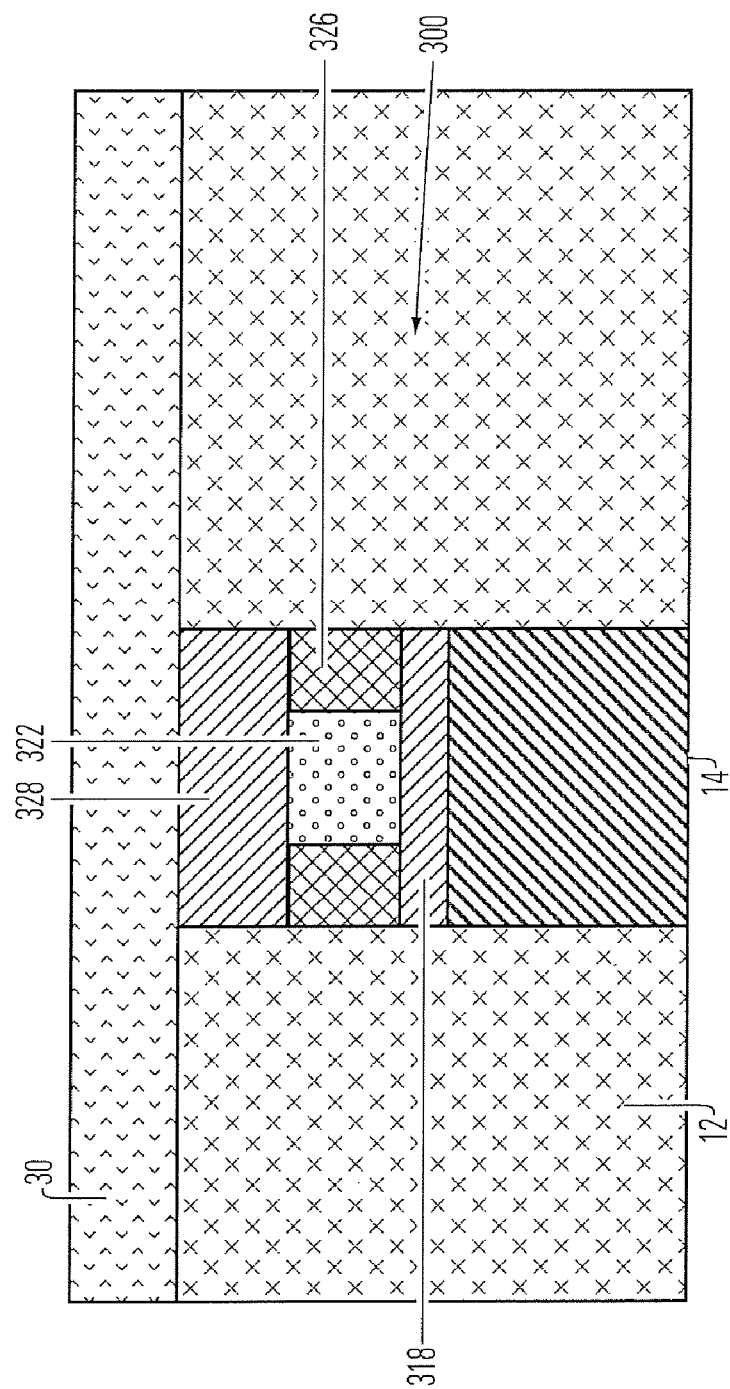
FIG. 17 illustrates another alternative embodiment of the random access memory cell of the present invention.

An alternate embodiment that offers a reduced structural complexity is shown in FIG. 16. There, the phase change memory element 200 is made up of only the phase change layer 222, located between the plug element 14 and bit line 30. Isolation layer 226 provides thermal isolation for the phase change material. An intermediate structure, phase change element 300, is seen in FIG. 17, which retains the phase change material layer 322 and the insulator layer 326, but in which two conductive layers 328 and 318 are provided, above and below the phase change layer. Yet another variation is seen in FIG. 17a, in which a second conductive layer 324 is added to the structure of phase change element 300, in a position and having a function tracking the previous discussion of second conductive element 24. Preferably, this embodiment does not include the upper phase change element 328 of FIG. 17.

Figure 18:
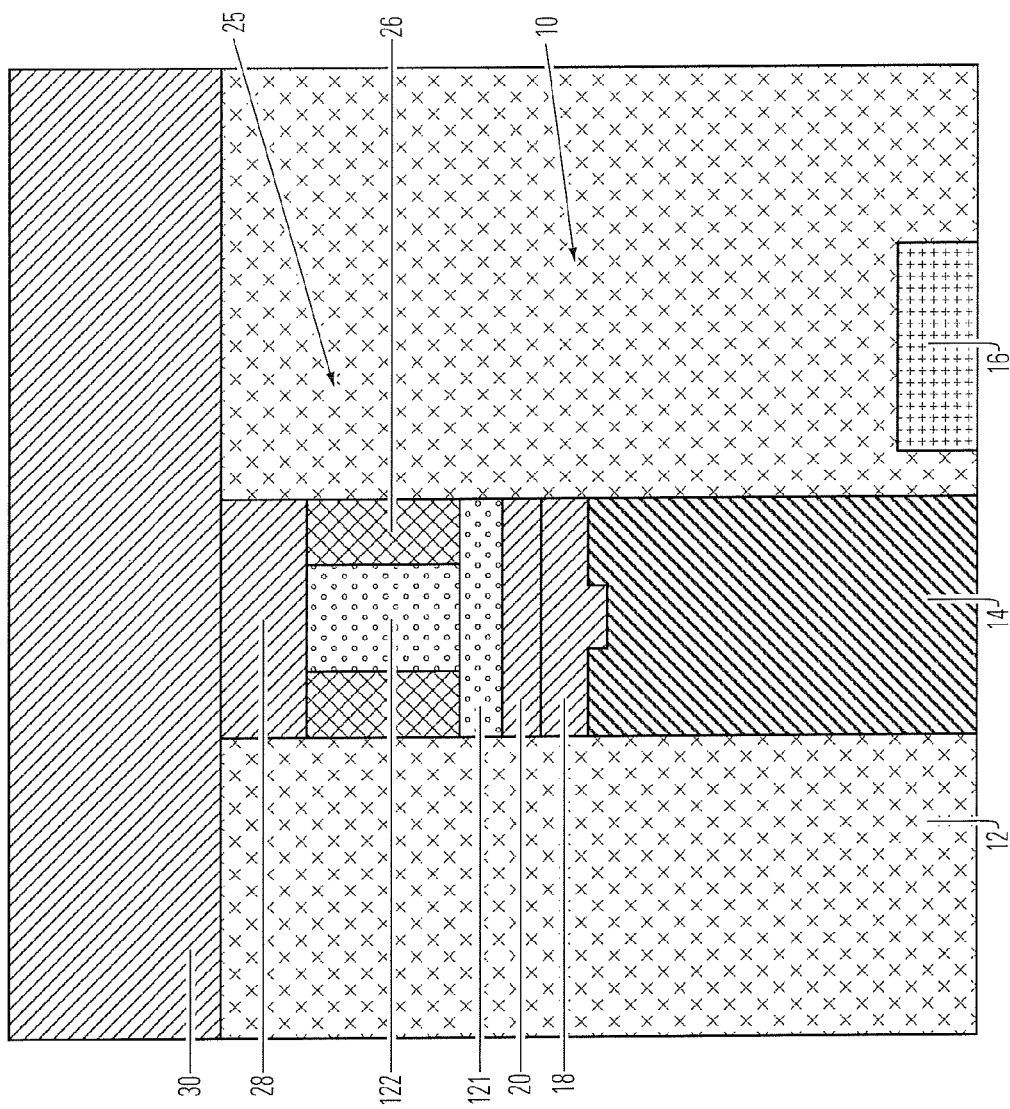
FIG. 18 illustrates a further alternative embodiment of the random access memory cell of the present invention.
Figure 19:
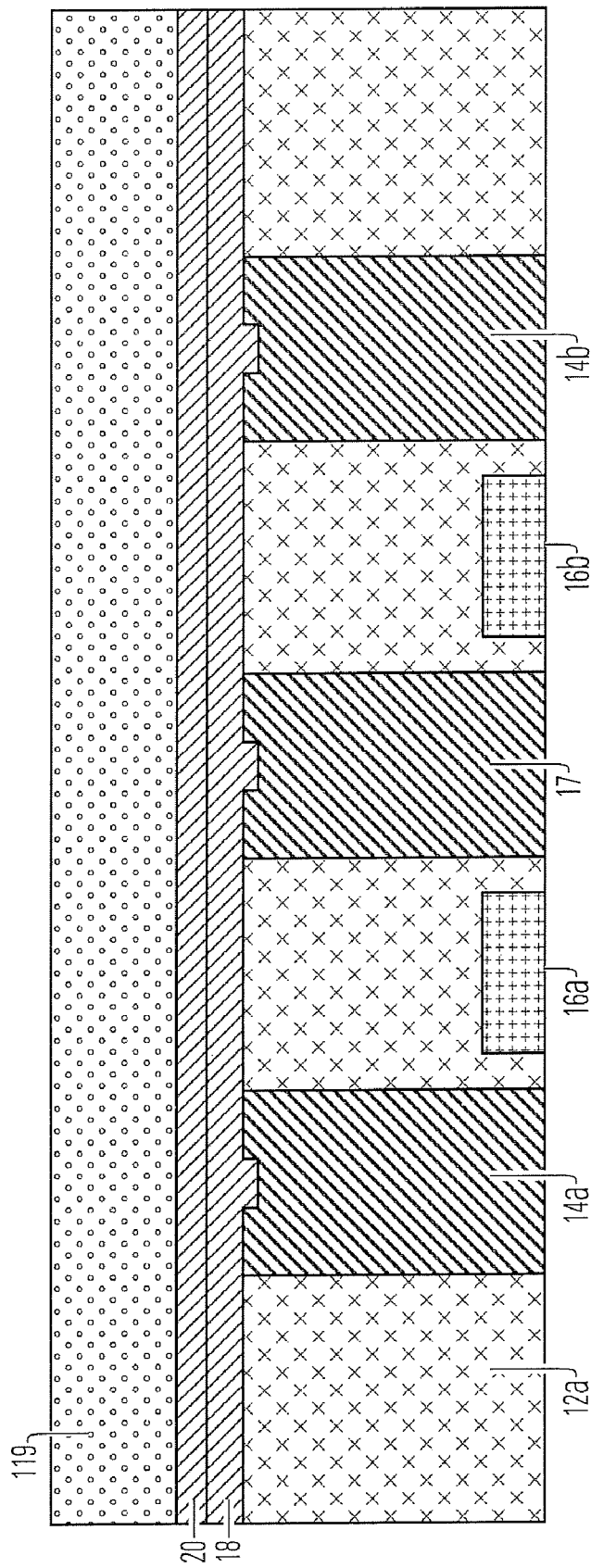
FIG. 19 illustrates an initial step in the fabrication of the random access memory cell shown in FIG. 18.

A further embodiment allows a more streamlined fabrication process. The structure of this embodiment is shown in FIG. 18. As sent there, a GST base 121 is formed atop lower conductive layer 20. The second conductive layer 24 of other embodiments is dispensed with, and phase change element 122 extends from the GST base 121 to the upper conductive layer 28. Function of this embodiment is similar to that of previous embodiments, with current flowing from control circuitry (not shown), through plug element 14, through the electrode conductive layer 18, lower conductive layer 20 and GST base 121, and then through the phase change element 122. Current then exits the element via upper conductive layer 28, to the bit line 30.

Figure 20:
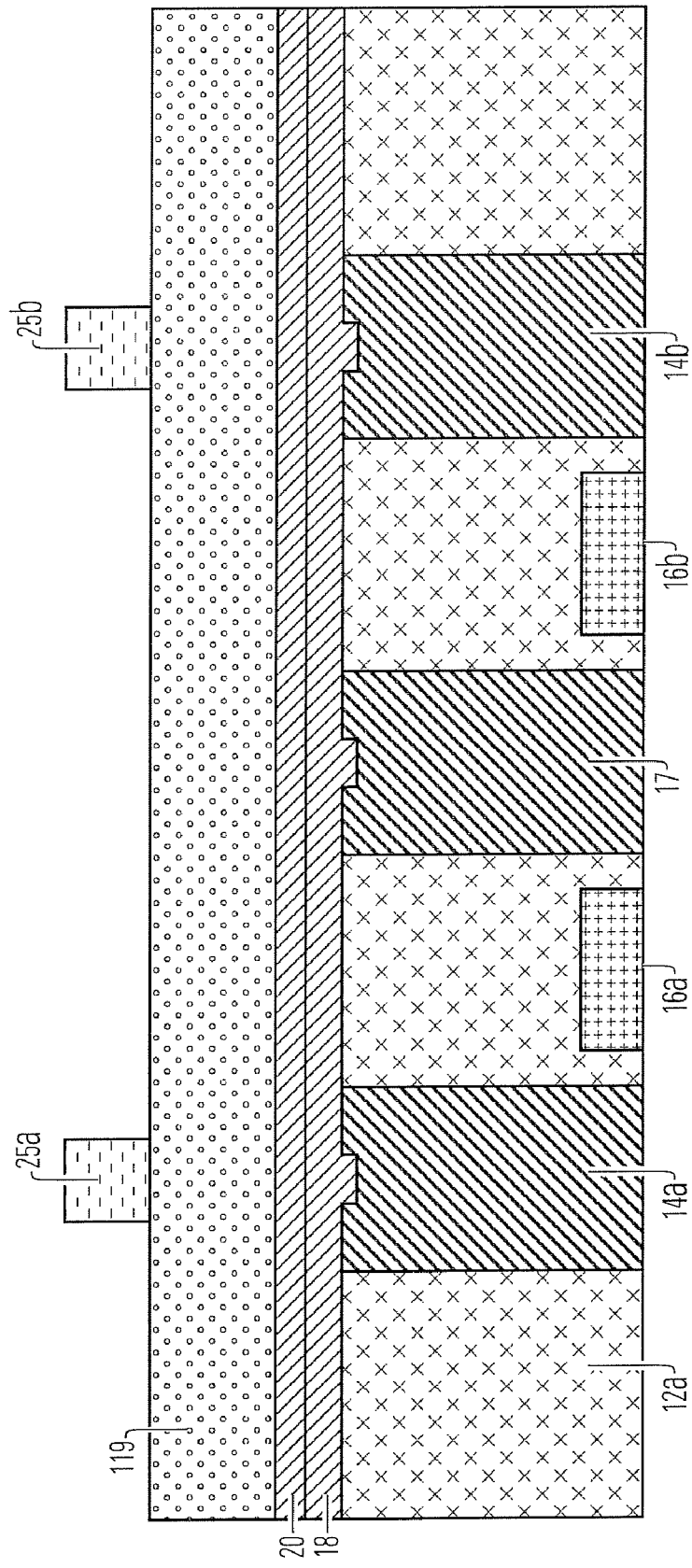
FIG. 20 illustrates a further step in the fabrication of the random access memory cell shown in FIG. 18.
Figure 21:
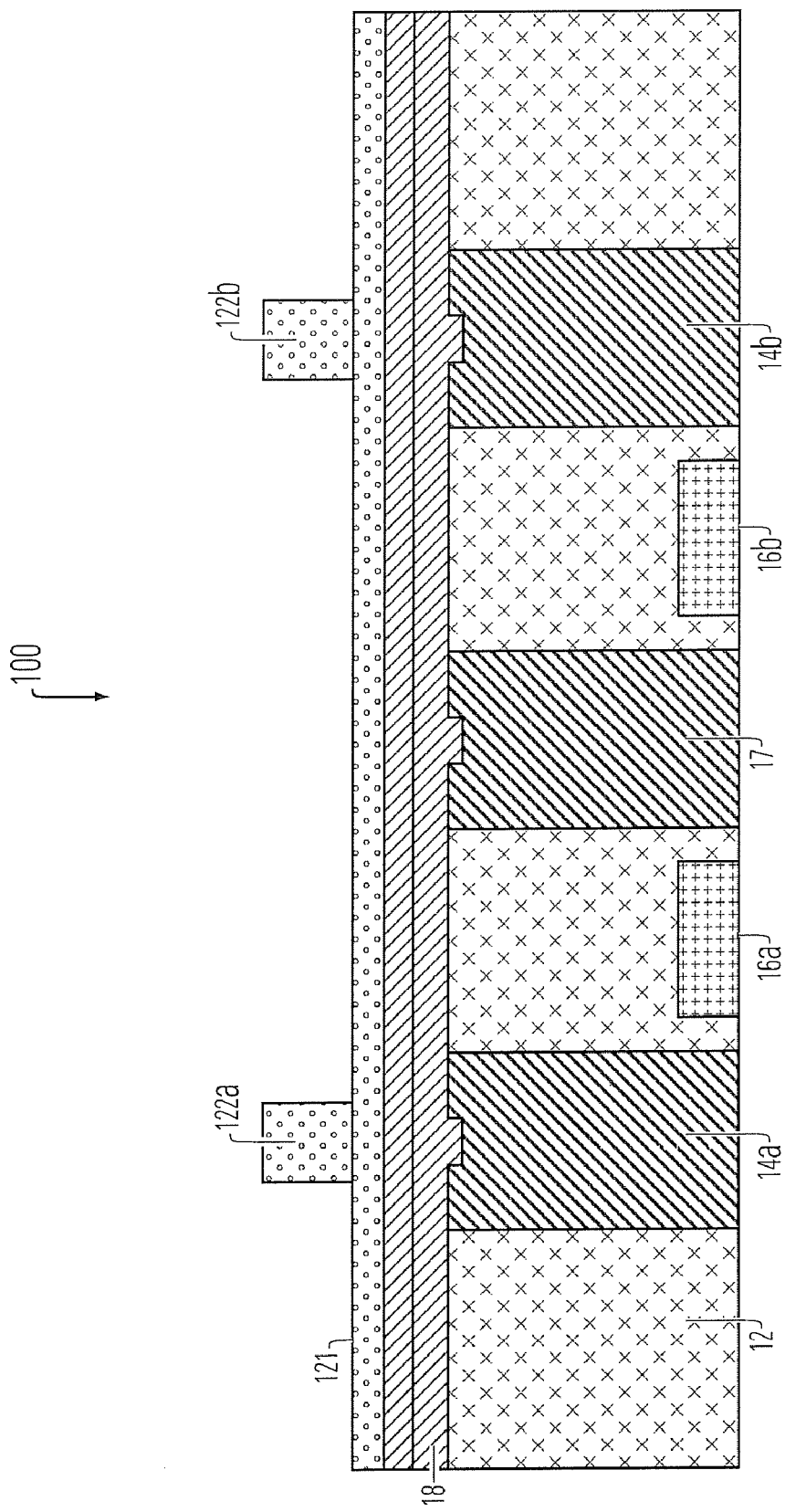
FIG. 21 illustrates a further step in the fabrication of the random access memory cell shown in FIG. 18.
Figure 22:
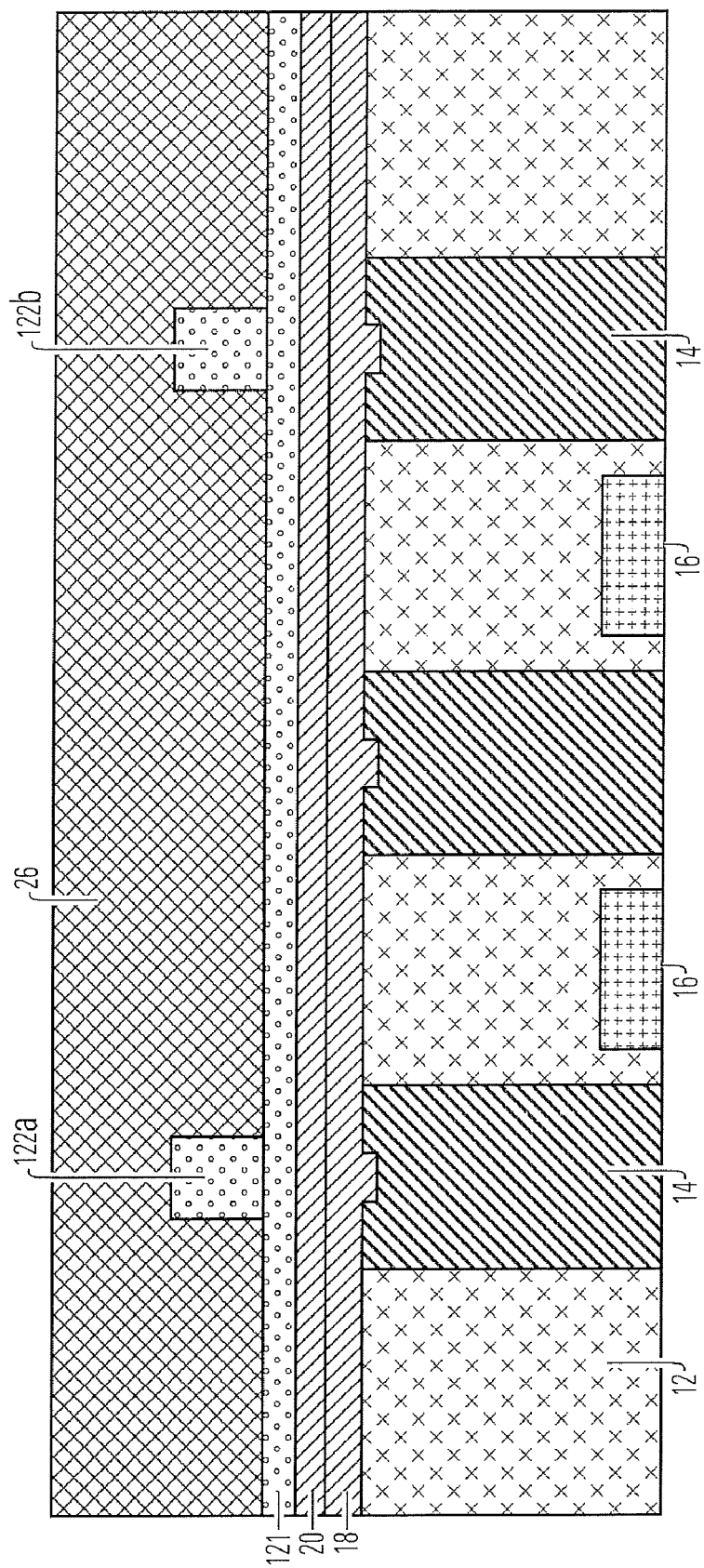
FIG. 22 illustrates a further step in the fabrication of the random access memory cell shown in FIG. 18.
Figure 23:
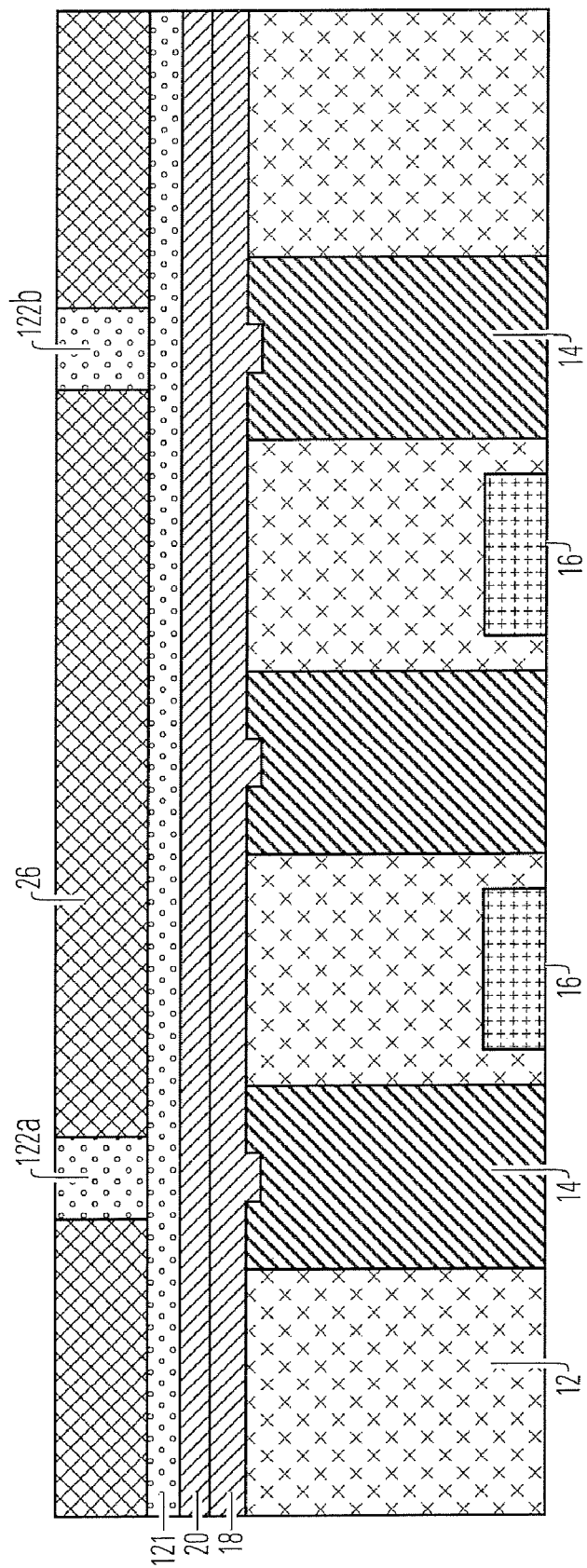
FIG. 23 illustrates a further step in the fabrication of the random access memory cell shown in FIG. 18.

Fabrication of the embodiment of FIG. 18 is shown in FIGS. 19-25. The initial stages of this process are identical to those of the previous embodiments, through the formation of the substrate and associated elements and deposition of the electrode conductive layer 18 and lower conductive layer 20. Picking up the process at FIG. 19, the GST layer 119 is deposited on the lower conductive layer. This layer is thicker than previous layers, as will be understood from the discussion below. The thickness of this layer preferably is between about 70 nm and 150 nm thick, and most preferably about 100 nm thick. The GST layer is lithographically patterned, as shown in FIGS. 20 and 21, to form a GST base, coextensive with the conductive layers, and phase change elements 122a and 122b, in the form of pillar-shaped structures projecting upward from the GST base. As discussed in connection with other lithographic processes, it is preferred to employ a trimming process to form lithographic mask elements having a smaller size than permitted by the minimum feature size of the given process. Unlike previous etching steps, this process does not completely remove the layer being etched. The remaining GST layer servers as a thermal isolation layer between phase change region and bottom electrode and provide better mechanical strength for the memory. Thickness is between 20 and 70 nm, and preferably 50 nm.

Figure 24:
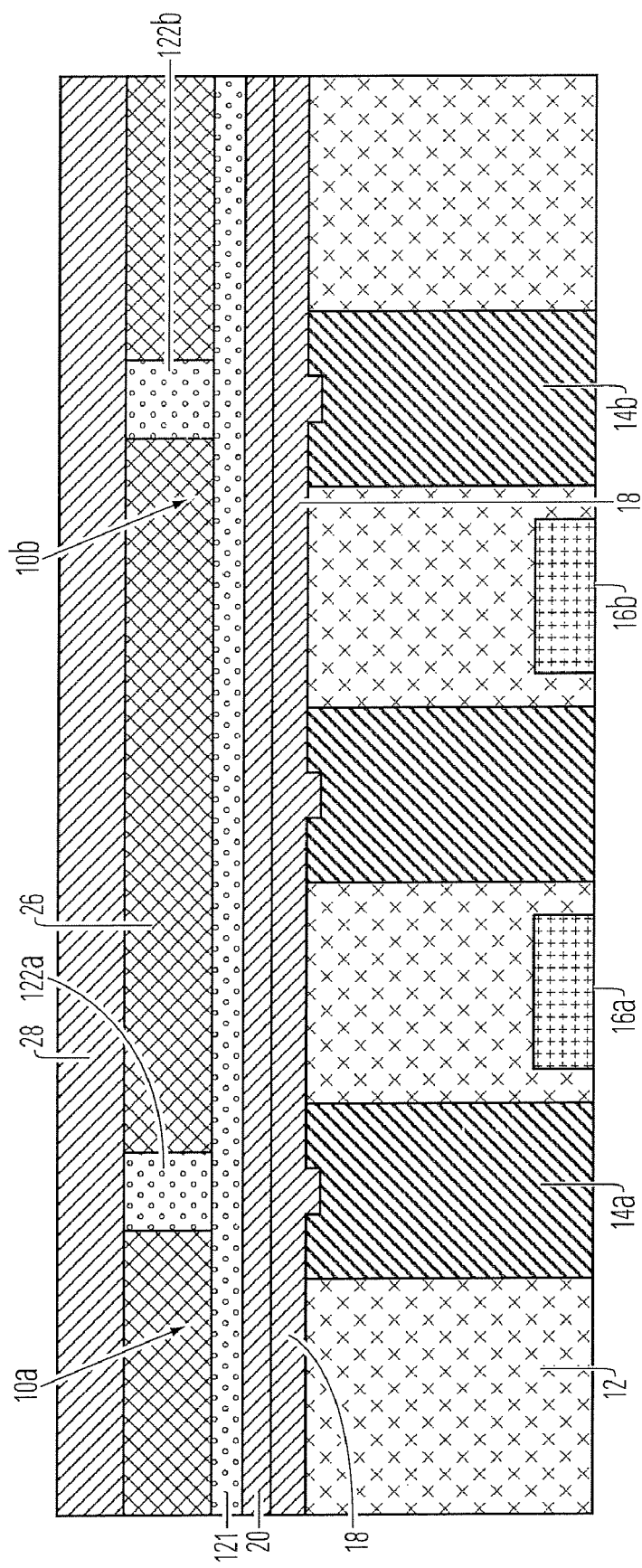
FIG. 24 illustrates a further step in the fabrication of the random access memory cell shown in FIG. 18.
Figure 25:
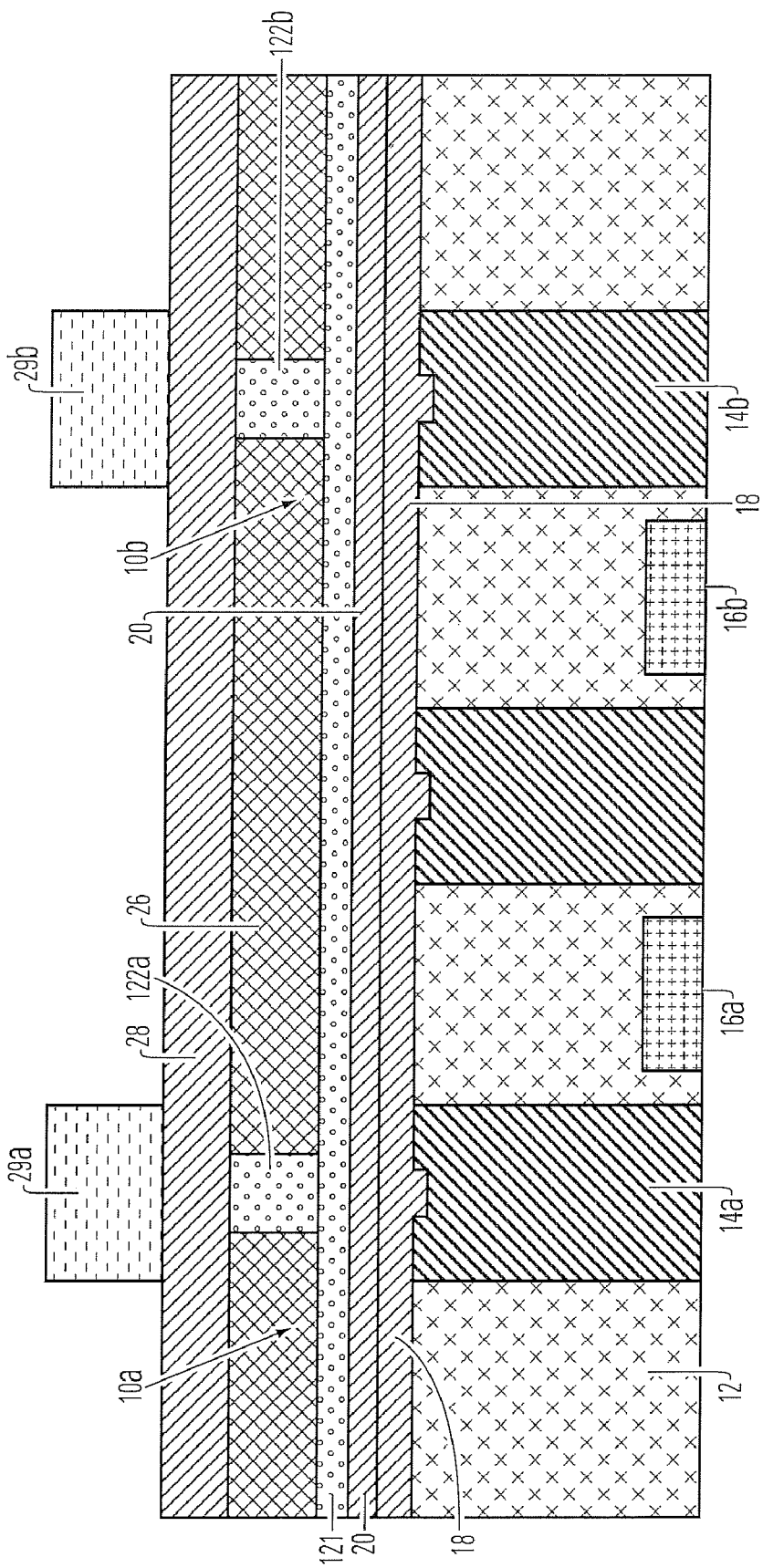
FIG. 25 illustrates a further step in the fabrication of the random access memory cell shown in FIG. 18.

The isolation material 26 is deposited in the next step (FIG. 22), preferably to a depth completely covering the phase change elements. That material is then removed, preferably employing a CMP process, shown in FIG. 23, to expose the upper surfaces of phase change elements 122a and 122b. As in the previous embodiments, an upper electrode layer 28, preferably composed of TiN, is deposited on the isolation material (FIG. 24). The individual memory elements are formed lithographically, beginning with the deposition of masks 29a and 29b, seen in FIG. 25. From that point, the process proceeds with conventional lithographic etching processes, followed by deposition of bit line 30 and additional dielectric fill material 31, to result in the structure seen in FIG. 18.

Dimensions set out in regard to prior embodiments are applicable to this embodiment as well, except for the thickness of GST layer. Discussions of materials above are likewise applicable here.

Those in the art will understand that a variety of alternatives and embodiments can be fashioned, all lying within the spirit of the invention disclosed herein. The invention itself, however, is defined solely in the claims appended hereto.

What is claimed is:

1. A method for fabricating a memory device, comprising:
   forming a base element;
   forming a lower conductive element on the base element;
   forming a phase change element on the lower conductive element;
   forming a conductive element on the phase change element;
   the phase change and conductive element forming steps further comprising creating the phase change and conductive elements during a common processing step so that the phase change and conductive elements are aligned with one another and have the same width;
   forming an isolating layer surrounding the phase change and the conductive elements; and
   forming an upper conductive layer on the isolating layer.

2. The method of claim 1, wherein the step of forming a base element includes:
   providing a substrate, including dielectric material having plug electrodes formed therein, having an upper surface exposing the plug electrodes; and
   forming an electrode conductive layer on the plug electrodes, wherein the electrode conductive layer includes a planarized surface.

3. The method of claim 1, further comprising the step of depositing an electrode member on the upper conductive layer.

4. The method of claim 1, wherein the step of forming an upper conductive layer includes:
   depositing an upper conductive material on the isolating layer; and patterning the upper conductive material to form an upper conductive element with a lateral extent greater than that of the top portion of the phase change element.

5. The method of claim 4 further comprising the step of depositing an electrode member on the upper conductive element.

6. The method of claim 1, wherein the isolating layer comprises a second phase change material.

7. The method of claim 1, wherein the phase change element has a thickness of between 10 and 100 nm.

8. The method of claim 1, wherein the phase change element has a thickness of 40 nm.

9. A method for fabricating a memory device, comprising:
   forming a base element;
   forming a lower conductive element on the base element;
   forming a phase change element on the lower conductive element;
   forming a conductive element on the phase change element;
   forming an isolating layer surrounding the phase change and the conductive elements;
   forming an upper conductive layer on the isolating layer;
   the steps of forming phase change and conductive elements comprising:
      employing lithographic elements for using a lithographic process characterized by a minimum feature size; and
   trimming the lithographic elements to a size below the minimum feature size.

10. A method for fabricating a memory device, comprising:
    forming a base element;
    forming a lower conductive element on the base element;
    forming a phase change element on the lower conductive element;
    forming a conductive element on the phase change element;
    forming an isolating layer surrounding the phase change and the conductive elements, the isolating layer comprising a material whose thermal conductivity and permittivity are less than that of silicon dioxide; and
    forming an upper conductive layer on the isolating layer.

* * * * *